(12) United States Patent
Kyono et al.

(10) Patent No.: US 9,806,494 B2
(45) Date of Patent: Oct. 31, 2017

(54) OPTICAL MODULE AND METHOD FOR MANUFACTURING THE OPTICAL MODULE

(71) Applicant: Sumitomo Electric Industries, Ltd., Osaka-shi (JP)

(72) Inventors: Takashi Kyono, Itami (JP); Hideyuki Ijiri, Itami (JP); Takao Nakamura, Itami (JP); Hiromi Nakanishi, Itami (JP); Takatoshi Ikegami, Itami (JP); Kuniaki Ishihara, Itami (JP); Yohei Enya, Itami (JP); Tetsuya Kumano, Itami (JP)

( * ) Notice: Subject to any disclaimer, the term of this patent is extended or adjusted under 35 U.S.C. 154(b) by 0 days.

(21) Appl. No.: 15/354,699

(22) Filed: Nov. 17, 2016

(65) Prior Publication Data

US 2017/0141531 A1    May 18, 2017

(30) Foreign Application Priority Data

Nov. 18, 2015 (JP) .................................. 2015-225736

(51) Int. Cl.
*H01S 5/00* (2006.01)
*H01S 5/022* (2006.01)
*G02B 6/42* (2006.01)

(52) U.S. Cl.
CPC ............ *H01S 5/022* (2013.01); *G02B 6/4239* (2013.01); *G02B 6/4251* (2013.01); *G02B 6/4265* (2013.01); *H01S 5/0222* (2013.01); *H01S 5/0226* (2013.01); *H01S 5/02212* (2013.01); *H01S 5/02288* (2013.01); *H01S 5/0228* (2013.01)

(58) Field of Classification Search
CPC .... H01S 5/022; H01S 5/0226; H01S 5/02288; H01S 5/02212; H01S 5/0228; H01S 5/0222

See application file for complete search history.

(56) References Cited

U.S. PATENT DOCUMENTS

| | | | |
|---|---|---|---|
| 2003/0128726 A1* | 7/2003 | Tatsuno | G11B 7/127 372/36 |
| 2004/0081410 A1* | 4/2004 | Aronson | H01S 5/02212 385/92 |
| 2007/0147449 A1* | 6/2007 | Bessho | H01S 5/02212 372/36 |
| 2007/0223548 A1* | 9/2007 | Ohbo | H01S 5/02212 372/44.01 |

FOREIGN PATENT DOCUMENTS

JP       2004-233885 A    8/2004

* cited by examiner

*Primary Examiner* — Kinam Park

(74) *Attorney, Agent, or Firm* — Venable LLP; Michael A. Sartori; Miguel A. Lopez

(57) ABSTRACT

An optical module 1 according to an embodiment includes a plurality of laser diodes (LDs) 21 to 23, a multiplexing optical system 30 combining a plurality of laser beams from the respective plurality of LDs, and a package 10 accommodating the plurality of LDs and the multiplexing optical system. The package includes a support mounted with the plurality of LDs and the multiplexing optical system, and a cap having a transmissive window that allows a resultant light beam to pass through. At least one of the LDs has an oscillation wavelength of nor more than 550 nm. The package has an internal moisture content of not more than 3000 ppm. The multiplexing optical system is fixed to the support by a resin curing adhesive.

13 Claims, 21 Drawing Sheets

Fig.21

|  | BAKING CONDITIONS | | MOISTURE CONTENT | OUTPUT DEGRADATION RATE |
| --- | --- | --- | --- | --- |
|  | TEMPERATURE | TIME | | |
| OPTICAL MODULE E1 | 80°C | 4 HOURS | 1800ppm | 8% |
| OPTICAL MODULE E2 | 80°C | 2 HOURS | 2500ppm | 16% |
| OPTICAL MODULE E3 | 80°C | 4 HOURS | 700ppm | 4% |
| OPTICAL MODULE E4 | (NO BAKING CARRIED OUT) | | 5400ppm | 65% |

OPTICAL MODULE AND METHOD FOR MANUFACTURING THE OPTICAL MODULE

TECHNICAL FIELD

The present invention relates to an optical module and a method for manufacturing the optical module. This application claims the priority of Japanese Patent Application No. 2015-225736 filed Nov. 18, 2015, the entire contents of which are incorporated herein by reference.

BACKGROUND

In an optical module having a plurality of laser diodes that are hermetically enclosed in a package and include a laser diode having an oscillation wavelength of not more than 550 nm, a dust collection effect such as described in Patent Document 1 (Japanese Unexamined Patent Publication No. 2004-233885) is known to take place. The dust collection effect is such that contaminants remaining inside the package adhere to, for example, emission end faces of the laser diodes. The laser diode having the oscillation wavelength of not more than 550 nm performs high-energy emission, so that the above dust collection effect is noticeable. When the dust collection effect takes place, output of the laser diode is degraded, thus resulting in reduced reliability of the optical module. Sources of contamination that cause the dust collection effect include a resin curing adhesive (for example, ultraviolet curable resin) that is used for bonding an optical component to another component. In a technique described in the Patent Document 1, because of not becoming a source of contamination, flux-free solder or an adhesive not containing Si-based organic substances is used to bond an optical component to another component for the purpose of reducing the above dust collection effect.

SUMMARY

An optical module according to an embodiment of the present invention includes: a plurality of laser diodes; a multiplexing optical system combining a plurality of laser beams emitted from the respective plurality of laser diodes and emitting a resultant light beam of the plurality of laser beams; and a package accommodating the plurality of laser diodes and the multiplexing optical system, wherein the package includes: a support mounted with the plurality of laser diodes and the multiplexing optical system; and a cap joined to the support for hermetically enclosing the plurality of laser diodes and the multiplexing optical system that are mounted to the support, the cap including a transmissive window for allowing the resultant light beam to pass through, wherein at least one of the plurality of laser diodes has an oscillation wavelength of not more than 550 nm, wherein the package has an internal moisture content of not more than 3000 ppm, and wherein the multiplexing optical system is fixed to the support by a resin curing adhesive.

BRIEF DESCRIPTION OF THE DRAWINGS

FIG. 21 is a table compiling the experiment results.

DETAILED DESCRIPTION

Figure 1:
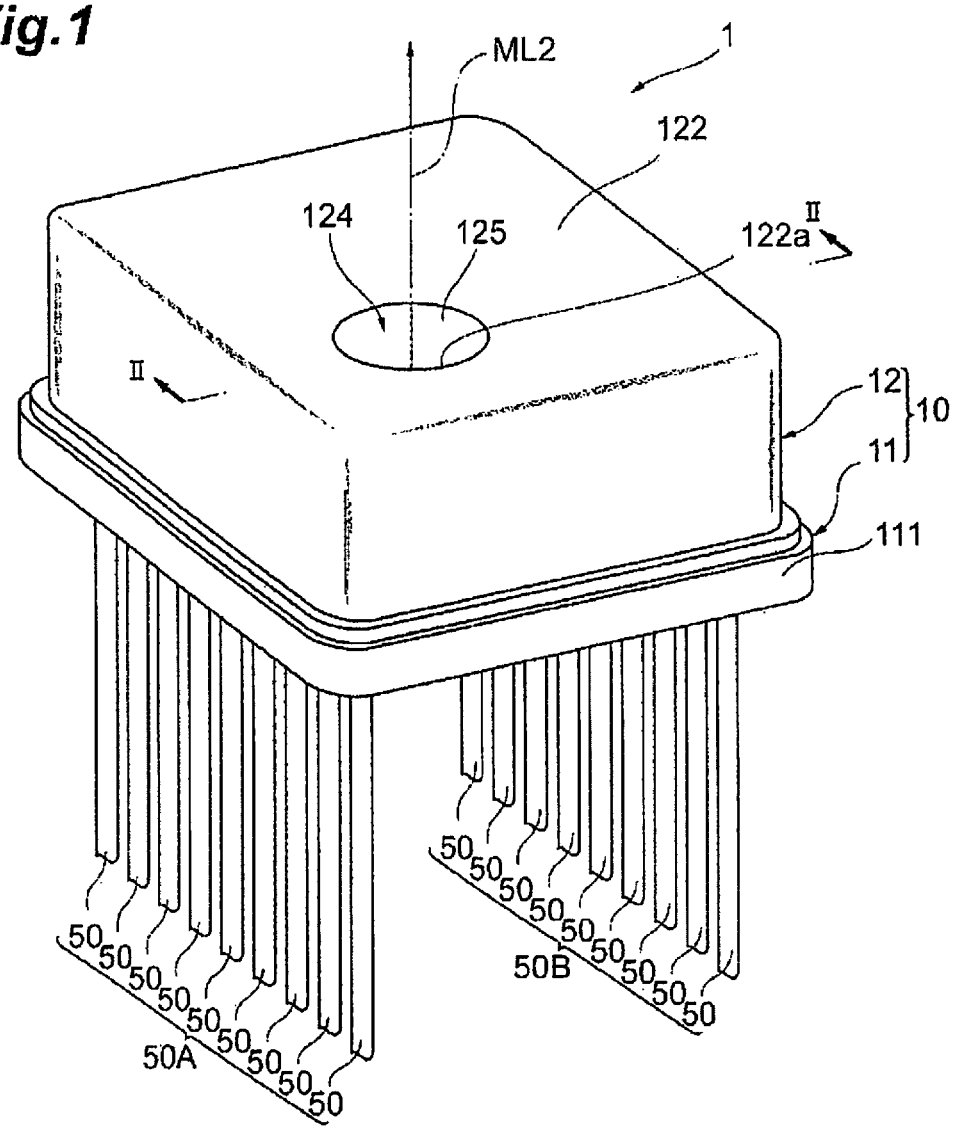
FIG. 1 is a perspective view of an illustrative optical module according to a first embodiment.

Description of Embodiments of the Present Invention

To begin with, contents of embodiments of the present invention are enumerated for explanation.

An optical module according to one aspect of the present invention includes: a plurality of laser diodes; a multiplexing optical system combining a plurality of laser beams emitted from the respective plurality of laser diodes and emitting a resultant light beam of the plurality of laser beams; and a package accommodating the plurality of laser diodes and the multiplexing optical system, wherein the package includes: a support mounted with the plurality of laser diodes and the multiplexing optical system; and a cap joined to the support for hermetically enclosing the plurality of laser diodes and the multiplexing optical system that are mounted to the support, the cap including a transmissive window for allowing the resultant light beam to pass through, wherein at least one of the plurality of laser diodes has an oscillation wavelength of not more than 550 nm, wherein the package has an internal moisture content of not more than 3000 ppm, and wherein the multiplexing optical system is fixed to the support by a resin curing adhesive.

In the above structure, the internal moisture content of the package is not more than 3000 ppm, so that even when the multiplexing optical system is bonded to the support by the resin curing adhesive inside the package, output degradation of the LD having the oscillation wavelength of not more than 550 nm can be reduced. For this reason, the optical module can have its reliability prevented from being deteriorated. The use of the resin curing adhesive for joining the multiplexing optical system to the support can also improve productivity of the optical module and reduce manufacturing costs.

An internal space of the package is defined by the support and the cap and may have a volume of not less than 200 mm$^3$. In cases where a package accommodates a plurality of laser diodes and a multiplexing optical system, an internal space of the package tends to have a volume increased to not less than 200 mm$^3$. By using a resin curing adhesive that simplifies a step of joining the multiplexing optical system to a support, the package having such a large volume is susceptible of enhanced productivity.

The plurality of laser diodes may be mounted to the support via respective sub-mounts corresponding to the respective plurality of laser diodes, and the sub-mounts may each be fixed to the support by a conductive adhesive. Even when the conductive adhesive is used for fixing the sub-mounts to the support, the internal moisture content of the package is not more than 3000 ppm, so that the reliability of the optical module can be prevented from being deteriorated. The use of the conductive adhesive for fixing the sub-mounts to the support can also improve the productivity of the optical module and reduce the manufacturing costs. Examples of the conductive adhesive include silver (Ag) paste, carbon (C) paste, and copper (Cu) paste. From the viewpoints of volume resistivity and connection resistance, the Ag paste is preferable.

The above oscillation wavelength may range from 435 nm to 465 nm or from 390 nm to 420 nm.

The optical module may further include a moisture absorbent disposed inside the package. With the moisture absorbent, the internal moisture content of the package can be decreased further.

The moisture absorbent may be provided to an inner wall of the cap. With the moisture absorbent provided to the inner wall of the cap, the support can secure enough space for the plurality of LDs and the multiplexing optical system.

The support may include a stem, and a base member mounted to the stem, and the plurality of laser diodes and the multiplexing optical system may be mounted to the base member.

The multiplexing optical system may include: a plurality of collimator lenses converting the plurality of laser beams to substantially collimated light beams, respectively, the plurality of collimator lenses corresponding to the respective plurality of laser beams emitted from the respective plurality of laser diodes; and a plurality of wavelength selective filters combining the plurality of laser beams that is converted to the substantially collimated light beams by the plurality of collimator lenses into one laser beam.

The internal moisture content of the package may be not more than 2000 ppm. Accordingly, further prevention of the reliability deterioration of the optical module is enabled.

The internal moisture content of the package may be not more than 1000 ppm. Accordingly, the prevention of the reliability deterioration of the optical module can be furthered.

A method for manufacturing an optical module according to another aspect of the present invention is a method for manufacturing an optical module in which a package including a support and a cap accommodates a plurality of laser diodes and a multiplexing optical system that combines a plurality of laser beams emitted from the respective plurality of laser diodes for generation of a resultant light beam that is emitted from a transmissive window provided to the cap, the method including the steps of: preparing an optical component mounting assembly including the plurality of laser diodes and the multiplexing optical system that are mounted to the support; and sealing the plurality of laser diodes and the multiplexing optical system above the support with the cap through joining of the cap and the support of the optical component mounting assembly so that the package has an internal moisture content of not more than 3000 ppm, wherein at least one of the plurality of laser diodes has an oscillation wavelength of not more than 550 nm, and wherein the multiplexing optical system of the optical component mounting assembly is bonded to the support by a resin curing adhesive.

The above method enables manufacture of the optical module containing not more than 3000 ppm of moisture inside the package, so that even when the multiplexing optical system is bonded to the support by the resin curing adhesive inside the package, output degradation of the LD having the oscillation wavelength of not more than 550 nm can be reduced. For this reason, the optical module that has its reliability deterioration prevented can be manufactured. The use of the resin curing adhesive for joining the multiplexing optical system to the support also enables improved productivity of the optical module and reduced manufacturing costs.

The step of sealing may include the steps of: baking the optical component mounting assembly and the cap that is to be joined to the support in a dry air atmosphere; and joining the cap to the support in a dry air atmosphere so that the baked cap hermetically encloses the plurality of laser diodes and the multiplexing optical system of the baked optical component mounting assembly.

Providing the baking step and joining the baked cap to the support in the dry air atmosphere for hermetic enclosure by the cap enable the moisture content to be not more than 3000 ppm.

According to the present disclosure, the optical module and the method for manufacturing the optical module can be provided, enabling prevention of reliability deterioration, improvement in productivity and reduction in manufacturing costs.

Details of the Embodiments of the Present Invention

A concrete description is provided hereinafter of the illustrative embodiments of the present invention with reference to the accompanying drawings. These illustrative embodiments are not restrictive of the present invention, and the present invention is defined by the scope of the claims and is intended to include everything equivalent in meaning to the scope of the claims and all modifications within the scope of the claims. In descriptions of the drawings, similar reference marks indicate similar elements, and redundant descriptions of those elements are omitted. In the description, terms indicative of directions, such as "above" and "below", are used based on states illustrated in the drawings for convenience.

First Embodiment

As shown in FIGS. 1 to 4, an optical module 1 according to the first embodiment includes a package 10, a first laser diode (LD) 21, a second LD 22, a third LD 23, and a multiplexing optical system 30. The optical module 1 may further include a mirror 41. Similarly, the optical module 1 may further include a photodiode (PD) 42. Similarly, the optical module 1 may further include a thermistor (temperature sensing resistor) 43. The following description applies to the optical module 1 equipped with the mirror 41, the PD 42, and the thermistor 43, unless otherwise noted.

In the optical module 1, a first laser beam L1 emitted from the first LD 21, a second laser beam L2 emitted from the second LD 22, and a third laser beam L3 emitted from the third LD 23 are combined by the multiplexing optical system 30, and a resultant light beam is emitted from the package 10. Specifically, the multiplexing optical system 30 combines the first laser beam L1 and the second laser beam L2 to generate a first resultant light beam ML1 and combines the first resultant light beam ML1 and the third laser beam L3 to generate a second resultant light beam ML2, and this second resultant light beam ML2 is emitted from the package 10.

The laser beams emitted by the respective first through third LDs 21 to 23 have respective wavelengths in a visible region. At least one of the first through third LDs 21 to 23 has the oscillation wavelength of not more than 550 nm. For example, the oscillation wavelength of the at least one of the first through third LDs 21 to 23 can be in a range of from 435 nm to 465 nm or in a range of from 390 nm to 420 nm.

In the following description, the oscillation wavelength of the first LD 21 is in a range of from 610 nm to 670 nm, the oscillation wavelength of the second LD 22 is in a range of from 500 nm to 550 nm, and the oscillation wavelength of the third LD 23 is in the range of from 435 nm to 465 nm.

Figure 2:
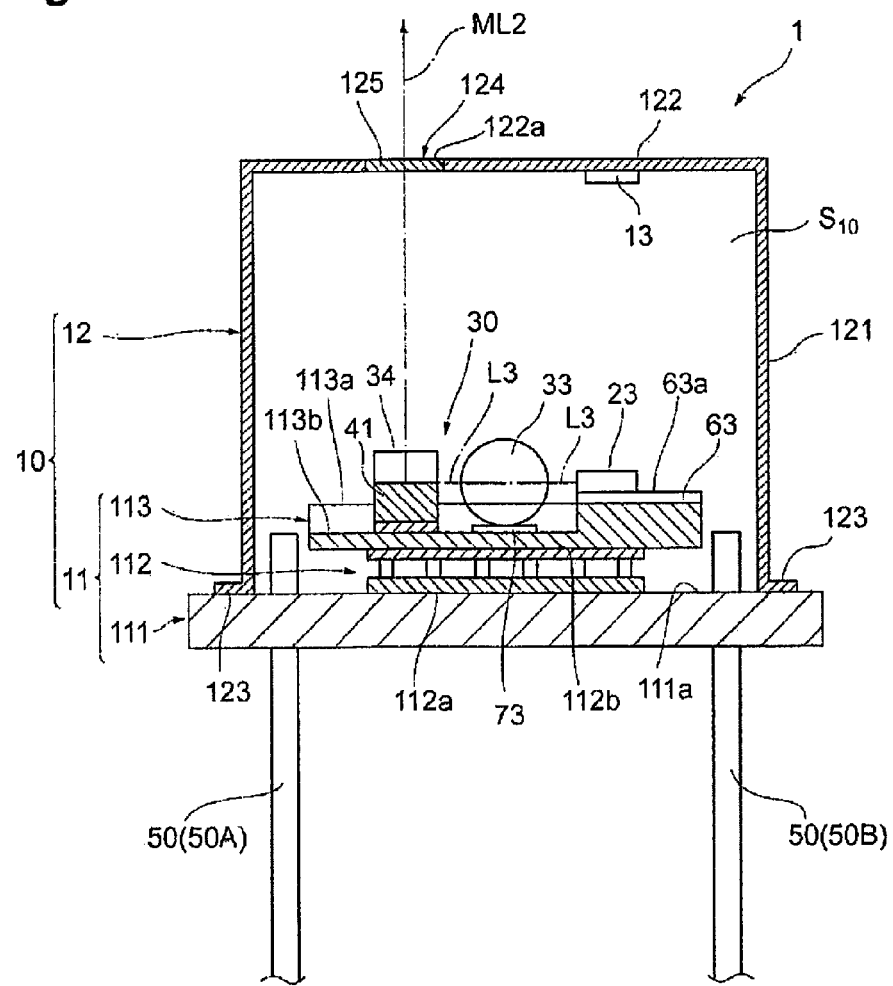
FIG. 2 is a sectional view taken along line II-II of FIG. 1.

As shown in FIGS. 1 and 2, the package 10 has a support 11 and a cap 12 and is formed by joining the cap 12 to the support 11. The first LD 21, the second LD 22, the third LD 23, and the multiplexing optical system 30 are accommodated by the package 10 in hermetically enclosed condition.

Figure 3:
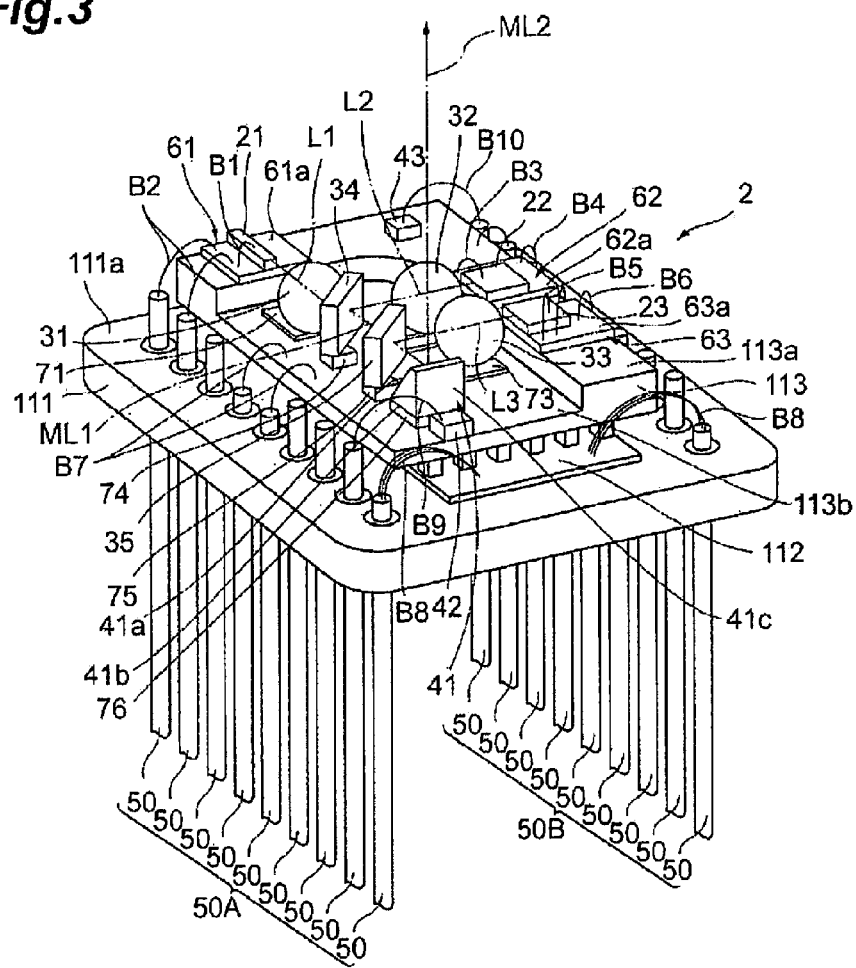
FIG. 3 is a perspective view of an optical component mounting assembly, illustrating the optical module of FIG. 1 with a cap removed.
Figure 4:
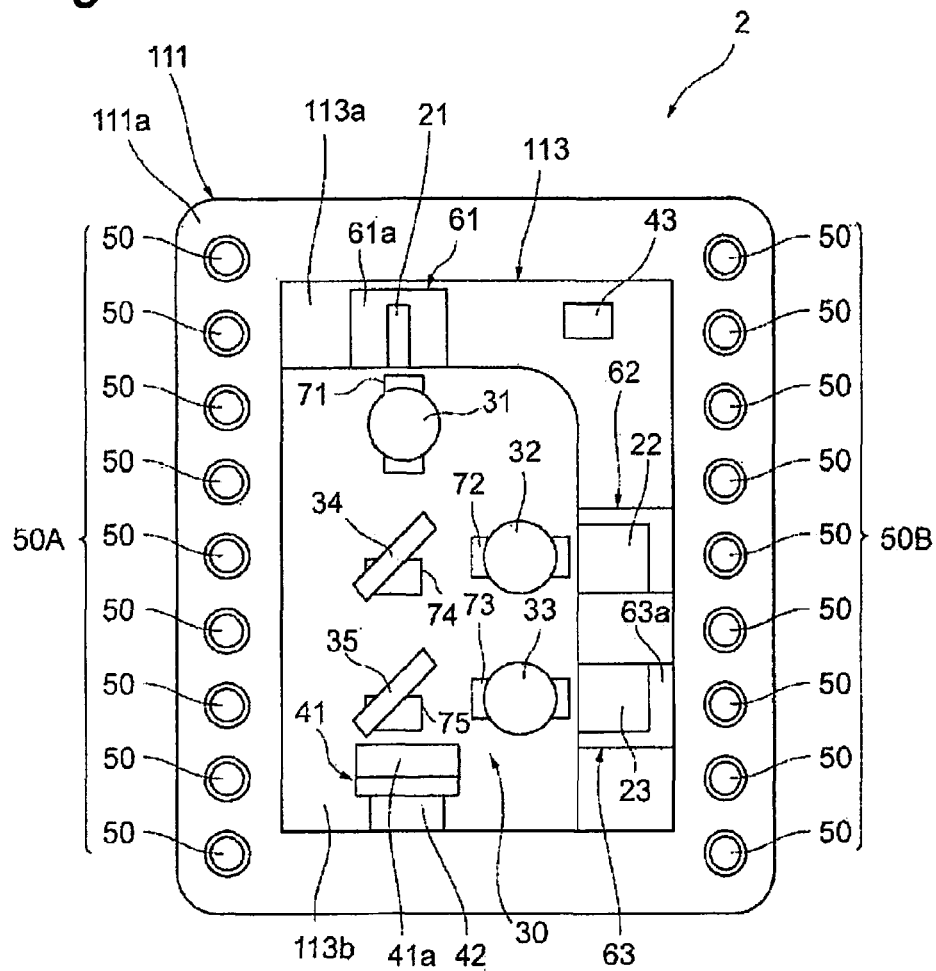
FIG. 4 is a plan view of the optical component mounting assembly shown in FIG. 3.

First, the support 11 and a structure on the support 11 are described through use of FIGS. 2 to 4. In FIG. 4, an illustration of wiring using, for example, bonding wires is omitted. The support 11 is a member for supporting the first LD 21, the second LD 22, the third LD 23, and the multiplexing optical system 30. As shown in FIG. 2, the support 11 includes a stem 111, a Thermo-Electric Cooler (TEC) 112 that is a temperature control element, and a base member 113. An assembly mounted with the first LD 21, the second LD 22, the third LD 23, and the multiplexing optical system 30 above the support 11 is also referred to as an optical component mounting assembly 2. The optical component mounting assembly 2 corresponds to the optical module 1 with the cap 12 removed.

The stem 111 is a plate-shaped member having a flat primary surface 111a. An example of a material for the stem 111 is a Ni/Au plated iron alloy. For convenience of explanation, a normal direction of the primary surface 111a is hereinafter referred to as a Z direction, and two directions orthogonal to the Z direction are hereinafter referred to as an X direction and a Y direction. The X direction and the Y direction are orthogonal to each other.

The stem 111 is provided with a lead pin group 50A having nine lead pins 50, and a lead pin group 50B having nine lead pins 50. The nine lead pins 50 of the lead pin group 50A are passed through the stem 111 in the normal direction of the primary surface 111a in insulated condition for arrangement in mutually parallel relationship. Similarly, the nine lead pins 50 of the lead pin group 50B are passed through the stem 111 in the normal direction of the primary surface 111a in insulated condition for arrangement in mutually parallel relationship. The lead pins 50 of the lead pin groups 50A, 50B project upward from the primary surface 111a of the stem 111.

The lead pin group 50A and the lead pin group 50B are spaced a predetermined distance away from each other in the Y direction. In the embodiment, the lead pin groups 50A, 50B are disposed along respective borders of the stem 111 to face each other in the Y direction.

Of the eighteen lead pins 50 of the lead pin groups 50A, 50B in total, the eight lead pins 50 are assigned for signals that are supplied to respective anodes and respective cathodes of first through third LDs 21 to 23 and the PD 42, the two lead pins 50 are assigned for supply of electric current to the TEC 112, and the other lead pins 50 are assigned as GND conductors.

The TEC 112 is mounted on the primary surface 111a of the stem 111. This TEC 112 can be disposed between the lead pin group 50A and the lead pin group 50B in the Y direction. As shown in FIGS. 2 and 3, the TEC 112 is fixed to the primary surface 111a by having its surface 112a bonded to the primary surface 111a. The surface 112a of the TEC 112 is bonded to the primary surface 111a by, for example, silver (Ag) paste. The surface 112a is flat and functions as a heat radiating surface. A wiring pad of the IEC 112 is electrically connected to the lead pins 50 by bonding wires B8. On a flat surface 112b of the TEC 112 that is opposite to the surface 112a, the base member 113 is mounted.

As shown in FIGS. 2 to 4, the base member 113 has a first surface 113a and a second surface 113b. The base member 113 is fixed to the TEC 112 by, for example, Ag paste. The base member 113 may be a conductive substrate made of an electrically conductive material or an insulating substrate made of an insulating material.

As shown in FIG. 4, the base member 113 has a quadrangular shape such as a rectangle or a square in planar view (or when viewed in a thickness direction of the stem 111). In cases where the base member 113 has the rectangular shape in planar view, the base member 113 has short sides that are each, for example, about 7 mm in length and long sides that are each, for example, 12 mm in length. In cases where the base member 113 has the square shape in planar view, one side of the base member 113 is, for example, about 10 mm in length. An example of the material for the base member 113 is a Ni/Au plated iron alloy.

As shown in FIGS. 2 and 3, the second surface 113b is at a lower level than the first surface 113a. In other words, the base member 113 has the first and second surfaces 113a, 113b at respective different levels, whereby a level difference is defined by these first and second surfaces 113a, 113b. The first and second surfaces 113a, 113b are parallel to each other.

Thus, the base member 113 has, in a plate-shaped member having the first surface 113a, such a notch as to define the second surface 113b. In other words, the base member 113 can be regarded as a member having an LD mounting part that is substantially L-shaped in planar view and is provided on and integrally with a primary surface of a plate-shaped main body. In this case, a region other than a region for the LD mounting part in the primary surface of the plate-shaped main body corresponds to the second surface 113b, and a surface of the LD mounting part corresponds to the first surface 113a.

As shown in FIGS. 2 to 4, the first surface 113a is the LD mounting surface (or an LD mounting region) mounted with the first through third LDs 21 to 23 and is substantially L-shaped when viewed in the thickness direction (Z direction) of the stem 111.

The first LD 21 emits the first laser beam L1. The first LD 21 has the oscillation wavelength in the range of from 610 nm in to 670 nm and is, for example, a red LD. The oscillation wavelength of the first LD 21 is, for example, 640 nm. The first LD 21 can be an LD chip. The first LD 21 is made of, for example, an AlGaAs ternary system material but is not limited to this. The first LD 21 may be made of a material that can achieve an oscillation wavelength within the range shown above, that is, a material capable of outputting a red light beam having a wavelength in a range of from about 610 nm to 670 nm.

The first LD 21 is mounted to the base member 113 so as to have an optical axis extending in the X direction or to emit the first laser beam L1 in the X direction. The first LD 21 is mounted on a primary surface 61*a* of a first sub-mount 61, thus being mounted to the first surface 113*a* of the base member 113 via the first sub-mount 61. The first LD 21 is bonded to the primary surface 61*a* by solder such as AuSn solder or Ag paste. The first sub-mount 61 is bonded to the first surface 113*a* by, for example, Ag paste (a conductive adhesive). The first LD 21 is electrically connected to the first sub-mount 61 by a bonding wire B1, and the first sub-mount 61 is electrically connected to the lead pins 50 by respective bonding wires 82. Along its optical axis that extends along the first surface 113*a*, the first LD 21 emits the first laser beam L1.

The second LD 22 emits the second laser beam L2. The second LD 22 has the oscillation wavelength in the range of from 500 nm to 550 nm and is, for example, a green LD. The oscillation wavelength of the second LD 22 is, for example, 535 nm. The second LD 22 can be an LD chip. The second LD 22 is made of, for example, an InGaN ternary system material but is not limited to this. The second LD 22 may be made of a material that can achieve an oscillation wavelength within the range shown above, that is, a material capable of outputting a green light beam having a wavelength in a range of from about 500 nm to 550 nm.

The second LD 22 is mounted to the first surface 113*a* such that a direction of an optical axis of the second LD 22 is orthogonal to a direction of the optical axis of the first LD 21 or the direction of the second laser beam L2 emitted from the second LD 22 is orthogonal to the direction of the first laser beam L1 emitted from the first LD 21. The second LD 22 is mounted on a primary surface 62*a* of a second sub-mount 62, thus being mounted to the first surface 113*a* of the base member 113 via the second sub-mount 62. The second LD 22 is bonded to the primary surface 62*a* by solder such as AuSn solder or Ag paste. The second sub-mount 62 is bonded to the first surface 113*a* by, for example, Ag paste (a conductive adhesive). The second LD 22 is electrically connected to the second sub-mount 62 by a bonding wire B3, and the second sub-mount 62 is electrically connected to the lead pin 50 by a bonding wire B4.

The third LD 23 emits the third laser beam L3. The third LD 23 has the oscillation wavelength in the range of from 435 nm to 465 nm and is, for example, a blue semiconductor laser. The third LD 23 can be an LD chip. The third LD 23 is made of, for example, a GaN-based material but is not limited to this. The third LD 23 may be made of a material that can achieve an oscillation wavelength within the range shown above, that is, a material capable of outputting a blue light beam having a wavelength in a range of from about 435 nm to 465 nm.

The third LD 23 is mounted to the first surface 113*a* such that a direction of an optical axis of the third LD 23 is orthogonal to the direction of the optical axis of the first LD 21 or the direction of the third laser beam L3 emitted from the third LD 23 is orthogonal to the direction of the first laser beam L1 emitted from the first LD 21. The third L1) 23 and the second LD 22 are disposed on the same side of the direction of the optical axis of the first LD 21 with the third. LD 23 being opposite to the first LD 21 relative to the second L1) 22 along the X direction.

The third LD 23 is mounted on a primary surface 63*a* of a third sub-mount 63, thus being mounted to the first surface 113*a* of the base member 113 via the third sub-mount 63. The third LD 23 is bonded to the primary surface 63*a* by solder such as AuSn solder or Ag paste. The third sub-mount 63 is bonded to the first surface 113*a* by, for example, Ag paste (a conductive adhesive). The third LD 23 is electrically connected to the third sub-mount 63 by a bonding wire B5, and the third sub-mount 63 is electrically connected to the lead pin 50 by a bonding wire B6.

In the first embodiment, the first through third sub-mounts 61 to 63 have their height settings so that respective laser beam emitting points of the first through third LDs 21 to 23 are at the same level above the first surface 113*a* of the base member 113. In other words, the respective optical axes of the first through third LDs 21 to 23 are substantially at the same level above the first surface 113*a*. In cases where the first through third LDs 21 to 23 are mounted epitaxial-side up, levels of respective light emission end faces of the first through third LDs 21 to 23 for the first through third laser beams L1, L2, L3 are in substantial agreement with levels of respective upper ends of the first through third LDs 21 to 23. In cases where the first through third LDs 21 to 23 are mounted epitaxial-side down, those levels of the respective light emission end faces of the first through third LDs 21 to 23 for the first through third laser beams L1, L2, L3 are in substantial agreement with levels of respective upper ends of the corresponding first through third sub-mounts 61 to 63.

Materials that can be used for the first through third sub-mounts 61 to 63 have thermal expansion coefficients close to respective thermal expansion coefficients of the semiconductor materials used for the first through third LDs 21 to 23 and can be, for example, AlN, SiC, Si or diamond. The first through third sub-mounts 61 to 63 can each be a single member or, more specifically, a single, plate-shaped member.

As shown in FIGS. 2 to 4, the second surface 113*b* is a multiplexing optical system mounting surface (or a multiplexing optical system mounting region) mounted with the multiplexing optical system 30. When viewed in the Z direction, the second surface 113*b* is disposed inwardly of the first surface 113*a*. On the second surface 113*b*, a wiring pad (not shown) may be provide,and this wiring pad is electrically connected to the lead pins 50 by bonding wires B7.

On the second surface 113*b*, a first sub-base member 71, a second sub-base member 72, a third sub-base member 73, a fourth sub-base member 74, and a fifth sub-base member 75 are provided to be mounted with a first collimator lens 31, a second collimator lens 32, a third collimator lens 33, a first wavelength selective filter 34, and a second wavelength selective filter 35 of the multiplexing optical system 30, respectively.

Materials that can be used for the first through fifth sub-base members 71 to 75 have thermal expansion coefficients close to respective thermal expansion coefficients of the first through third collimator lenses 31 to 33 and the first and second wavelength selective filters 34, 35 and can be, for example, glass. The first through fifth sub-base members 71 to 75 may be made of ceramic or metal. The first through fifth sub-mounts 71 to 75 can each be a single member or, more specifically, a single, plate-shaped member. The first through fifth sub-base members 71 to 75 are fixed to the second surface 113*b* by, for example, Ag paste. The materials for the first through fifth sub-base members 71 to 75 may be the same as the material for the base member 113 in order to obtain a single molded article combining the first through fifth sub-base members 71 to 75 with the base member 113. To be mounted with the first through third collimator lenses 31 to 33 and the first and second wavelength selective filters 34, 35, respective mounting surfaces (upper surfaces) of the first through fifth sub-base members 71 to 75 preferably have respective areas susceptible of application of a required amount of the adhesive for fixing the first through third collimator lenses 31 to 33 and the first and second wavelength selective filters 34, 35, and it is preferable that those areas each range from, for example; about 0.3 to 0.5 square mm. The first through fifth sub-base members 71 to 75 each have a thickness of, for example, about 0.1 mm.

The multiplexing optical system 30 includes the first collimator lens 31, the second collimator lens 32, the third collimator lens 33, the first wavelength selective filter 34, and the second wavelength selective filter 35.

The first collimator lens 31 is optically coupled to the light emission end face of the first LD 21 to collimate (parallelize) the first laser beam L1 emitted from the first LD 21. The first collimator lens 31 has a focal length of, for example, less than 5 mm. The first collimator lens 31 is mounted on the first sub-base member 71, thus being mounted to the second surface 113b of the base member 113 via the first sub-base member 71. The first collimator lens 31 is fixed by being bonded to the first sub-base member 71 by a resin curing adhesive. Examples of the resin curing adhesive include ultraviolet curable resin, thermosetting resin, and resin cured by ultraviolet light and heat in combination.

The second collimator lens 32 is optically coupled to the light emission end face of the second LD 22 to collimate the second laser beam L2 emitted from the second LD 22. A focal length of the second collimator lens 32 is, for example, similar to that of the first collimator lens 31. The second collimator lens 32 is mounted on the second sub-base member 72, thus being mounted to the second surface 113b of the base member 113 via the second sub-base member 72. The second collimator lens 32 is fixed by being bonded to the second sub-base member 72 by a resin curing adhesive. Examples of the resin curing adhesive used for the second collimator lens 32 are similar to the examples of the resin curing adhesive used for the first collimator lens 31.

The third collimator lens 33 is optically coupled to the light emission end face of the third LD 23 to collimate the third laser beam L3 emitted from the third LD 23. A focal length of the third collimator lens 33 is, for example, similar to that of the first collimator lens 31. The third collimator lens 33 is mounted on the third sub-base member 73 disposed next to the second sub-base member 72 in the X direction. The third collimator lens 33 is mounted to the second surface 113b of the base member 113 via the third sub-base member 73. The third collimator lens 33 is fixed by being bonded to the third sub-base member 73 by a resin curing adhesive. Examples of the resin curing 10 adhesive used for the third collimator lens 33 are similar to the examples of the resin curing adhesive used for the first collimator lens 31.

Respective optical axes of the first through third collimator lenses 31 to 33 and the respective optical axes of the first through third LDs 21 to 23 are adjusted for substantial mutual alignment. In one example, the first through third sub-mounts 61 to 63 each have a thickness of 0.15 mm, and levels of the respective laser beam emitting points of the first through third LDs 21 to 23 above the respective primary surfaces 61a to 63a of the first through third sub-mounts 61 to 63 are each 0.1 mm, so that the levels of those laser beam emitting points above the first surface 113a are each 0.25 mm.

Here, in cases where the first through third collimator lenses 31 to 33 are each held by a lens holder that has a square shape with 1.0 mm sides when viewed from its side, and a distance from the side of the lens holder viewed from its side to a lens center is 0.5 mm, the optical axes of the first through third LDs 21 to 23 are in substantial agreement in level with the respective optical axes of the first through third collimator lenses 31 to 33 when the level difference between the first surface 113a and the second surface 113b has a height of about 0.25 mm.

When a vertical margin of alignment for aligning the first through third collimator lenses 31 to 33 and a coating thickness of the resin curing adhesive used for fixing the respective lens holders of the first through third collimator lenses 31 to 33 above the second surface 113b are taken into consideration, it is preferable that the level difference between the first surface 113a and the second surface 113b of the base member 113 is higher by about several hundred µm than 0.25 mm. Thus, for example, a thickness of the base member 113 itself (a thickness of the LD mounting region of the base member 113) can be 1.0 mm, a thickness of the base member 113 at its second surface 113b (a thickness of the lens mounting region of the base member 113) can be 0.4 mm, and a height of the level difference between the first surface 113a and the second surface 113b can be 0.6 mm.

The first wavelength selective filter 34 is, for example, a multilayer film filter formed on a glass substrate and is mounted to the second surface 113b of the base member 113 via the fourth sub-base member 74. The first wavelength selective filter 34 is disposed above the second surface 113b to be positioned at an intersection of the optical axes of the first and second LDs 21, 22. The first wavelength selective filter 34 is fixed by being bonded to the fourth sub-base member 74 by a resin curing adhesive. Examples of the resin curing adhesive used for the first wavelength selective filter 34 are similar to the examples of the resin curing adhesive used for the first collimator lens 31. The first wavelength selective filter 34 has one side optically coupled to the first collimator lens 31 and the other side optically coupled to the second collimator lens 32.

The first wavelength selective filter 34 transmits the first laser beam L1 collimated by the first collimator lens 31 and reflects the second laser beam L2 collimated by the second collimator lens 32 toward the second wavelength selective filter 35. An optical axis of the first laser beam L1 transmitted by the first wavelength selective filter 34 and an optical axis of the second laser beam L2 reflected by the first wavelength selective filter 34 arc adjusted to be in substantial alignment with each other. In this way, the first wavelength selective filter 34 outputs the first resultant light beam ML1 of the first laser beam L1 and the second laser beam L2.

Similarly to the first wavelength selective filter 34, the second wavelength selective filter 35 is, for example, a multilayer film filter formed on a glass substrate and is mounted to the second surface 113b of the base member 113 via the fifth sub-base member 75. The second wavelength selective filter 35 is disposed above the second surface 113b to be positioned at an intersection of the optical axes of the first and third LDs 21, 23. Thus, the second wavelength selective filter 35 is disposed opposite to the first LD 21 relative to the first wavelength selective filter 34. The second wavelength selective filter 35 is fixed by being bonded to the fifth sub-base member 75 by a resin curing adhesive.

Examples of the resin curing adhesive used for the second wavelength selective filter 35 are similar to the examples of the resin curing adhesive used for the first collimator lens 31. The second wavelength selective filter 35 has one side optically coupled to the other side of the first wavelength selective filter 34 and the other side optically coupled to the third collimator lens 33.

The second wavelength selective filter 35 transmits the first and second laser beams L1, L2 (the first resultant light beam ML1) that are emitted from the first wavelength selective filter 34 and reflects the third laser beam. L3 collimated by the third collimator lens 33 toward a side opposite to the first wavelength selective filter 34 along the X direction. Respective optical axes of the first laser beam L1 and the second laser beam L2 that are transmitted by the second wavelength selective filter 35 and an optical axis of the third laser beam L3 reflected by the second wavelength selective filter 35 are adjusted to be in substantial alignment with one other. In this way, the second wavelength selective filter 35 outputs the second resultant light beam ML2 of the first resultant light beam ML1 and the third laser beam L3.

Preferably, respective center positions of the first and second wavelength selective filters 34 and 35 are substantially at the same levels above the second surface 113$b$ of the base member 113 as the respective optical axes of the first through third laser beams L1, L2, L3.

The mirror 41 is mounted to the second surface 113$b$ of the base member 113 via a sixth sub-base member 76. The mirror 41 is fixed to the sixth sub-base member 76 by, for example, a resin curing adhesive. The mirror 41 is disposed opposite to the first wavelength selective filter 34 relative to the second wavelength selective filter 35 along the X direction. The mirror 41 reflects a portion of the second resultant light beam ML2 upward (in a direction opposite to the base member 113) and transmits the remainder. When viewed from its side, the mirror 41 has the shape of a right triangle having a slant face 41$a$, a bottom face 41$b$, and a side face 41$c$. In other words, the mirror 41 has the slant face 41$a$ that is inclined to a direction in which an optical axis of the second resultant light beam ML2 extends, and the bottom face 41$b$. The slant face 41$a$ forms an angle of substantially 45 degrees with the second surface 113$b$. The bottom face 41$b$ is fixed to the base member 113.

The slant face 41$a$ of the mirror 41 reflects the second resultant light beam ML2 in the direction intersecting the second surface 113$b$. The slant face 41$a$ is formed with, for example, a semitransparent film, thus having a light reflectance of 95% and a light transmittance of 5%. The light that is transmitted by the slant face 41$a$ is refracted at the slant face 41$a$ in a direction approaching the second surface 113$b$.

The PD 42 is mounted on the second surface 113$b$ of the base member 113. The PD 42 is used for monitoring the first through third laser beams L1, L2, L3. The PD 42 is electrically connected to the lead pin 50 by a bonding wire B9. The PD 42 is disposed in a lower position along a direction slanting from the side face 41$c$ of the mirror 41. The PD 42 is capable of detecting intensity of the second resultant light beam ML2 by receiving the light refracted at the slant face 41$a$ of the mirror 41. Preferably, the PD 42 is highly sensitive to the first laser beam L1, the second laser beam L2, and the third laser beam L3 and is, for example, a Si photodiode.

The thermistor 43 is disposed next to the first LD 21 on the first surface 113$a$ of the base member 113. The thermistor 43 is fixed to the base member 113 by, for example, Ag paste. The thermistor 43 is electrically connected to the lead pin 50 by a bonding wire B10.

Referring to FIG. 2, a further description is provided of the package 10. The first through third LDs 21 to 23, the multiplexing optical system 30, and others that are provided above the support 11 are hermetically enclosed by the cap 12. The cap 12 has a tubular part 121 and a bottom 122, thus having the shape of a bottomed tube.

The tubular part 121 defines a peripheral sidewall of the cap 12. A flange 123 may be provided along an edge of one opening of the tubular part 121. A shape of the tubular part 121 in planar view or in sectional view orthogonal to a central axis of the tubular part 121, is for example, a quadrangle such as a square or a rectangle.

The bottom 122 is provided integrally with an end of the tubular part 121 so as to close an opening of the tubular part 121. In cases where the tubular part 121 is provided with the flange 123, the opening opposite to the flange 123 is closed by the bottom 122. The bottom 122 is provided with a transmissive window 124 for allowing the second resultant light beam ML2 to pass through. Specifically, the bottom 122 is formed with an opening 122$a$, and a transmissive window member 125 is provided in this opening 122$a$, whereby the transmissive window 124 is formed. The transmissive window member 125 may be a member that is capable of transmitting the second resultant light beam ML2, such as a member made of resin transmissive to the second resultant light beam ML2 or a glass member. The transmissive window member 125 may even be a lens. For example, a lens such as to focus the second resultant light beam ML2 on a point on the optical axis of the second resultant light beam ML2 may be used as the transmissive window member 125.

The cap 12 is joined to the support 11 by, for example, welding at its side opposite to the bottom 122, that is, at its open side (its side with the opening).

An internal space $S_{10}$ of the package 10 having the support 11 and the cap 12, that is to say, a space defined by the primary surface 111$a$ of the stem 111 of the support 11 and the cap 12 (or a space accommodating the LDs and others) has a volume of not less than 200 mm$^3$. This means that the volume of the internal space $S_{10}$ of the package 10 is greater than a volume (ranging, for example, from 20 mm$^3$ to 50 mm$^3$) of an internal space of a CAN package. The volume of the internal space $S_{10}$ of the package 10 is normally not more than 1200 mm$^3$.

The package 10 has an internal moisture content of not more than 3000 ppm, preferably not more than 2000 ppm, or more preferably not more than 1000 ppm. A moisture content is a value measured in accordance with a method defined in MIL. Specification 883 or, more specifically, in accordance with method 1018.2 of MIL-STD-883E that relates to INTERNAL WATER-VAPOR CONTENT. In other words, the moisture content is obtained by measuring, with the optical module 1 placed in a vacuum chamber adjusted to a predetermined degree of vacuum, gas inside the vacuum chamber by means of a mass spectrometer for moisture content monitoring, thereafter breaking the package by means of, for example, a piercing tool inside the vacuum chamber and measuring a change in the moisture content measured by the mass spectrometer. The lower the moisture content, the more preferable it is; however, because of constraints on detection accuracy, a lower limit of the moisture content can be 100 ppm.

To have its moisture content in the above range, the optical module 1 may include a moisture absorbent 13 as shown in FIG. 2. The moisture absorbent 13 can be fixed to, for example, an inner wall of the cap 12. On the bottom 122 of the cap 12, the moisture absorbent 13 can be disposed, for example, in a position close to the third LD 23 (for example, right above the third LD 23 in the Z direction). Examples of the moisture absorbent 13 include zeolite and calcium oxide-based material that are each in granular, sheet and paste forms.

Figure 5:
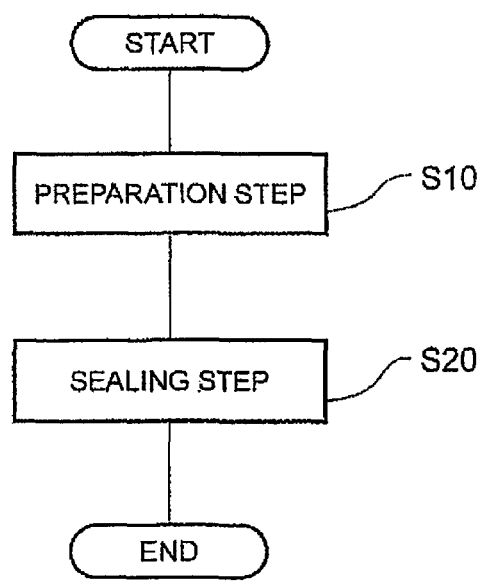
FIG. 5 is a flowchart of a method for manufacturing the optical module according to the first embodiment.

A description is provided next of an illustrative method for manufacturing the optical module 1. As shown in FIG. 5, the method for manufacturing the optical module 1 includes preparation step S10 and sealing step S20, and each of these steps is described. The following description refers to a case where the stem 111 that is previously provided with the lead pins 50 and the base member 113 that is previously provided with the first through sixth sub-base members 71 to 76 at predetermined positions on the second surface 113b are used.

[Preparation Step]

In preparation step S10, the optical component mounting assembly 2 shown in FIG. 3 is prepared. The preparation of the optical component mounting assembly 2 has no limitation on the order in which the optical components, that is, the first through third LDs 21 to 23, the first through third collimator lenses 31 to 33 of the multiplexing optical system 30, and the first and second wavelength selective filters 34, 35 of the multiplexing optical system 30, and others are mounted to the support 11, provided that the second resultant light beam ML2 can be generated as desired. An example of preparation step S10 is detailed.

Figure 6:
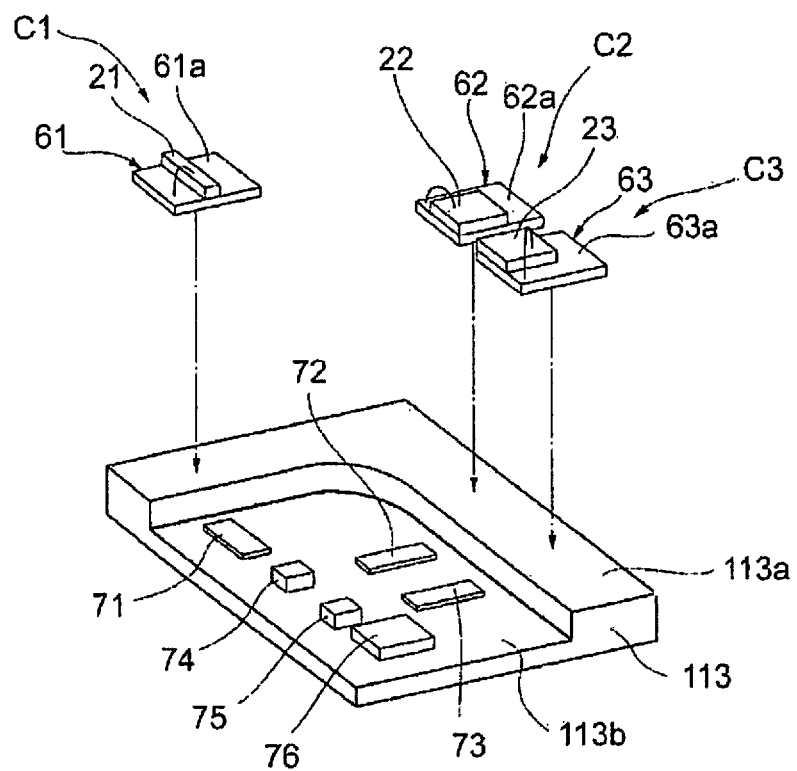
FIG. 6 illustrates a step of mounting a first through a third laser diode (LD) to a base member.

In preparation step S10, as shown FIG. 6, the first through third LDs 21 to 23 are mounted on the respective primary surfaces 61a, 62a, 63a of the first through third sub-mounts 61 to 63. The first through third LDs 21 to 23 are bonded to the corresponding primary surfaces 61a, 62a, 63a by, for example, the solder such as the AuSn solder. Next, electric conduction is ensured by wire bonding from respective top electrodes of the first through third LDs 21 to 23 (that are opposite to the first through third sub-mounts 61 to 63) to respective patterns of the first through third sub-mounts 61 to 63. In this way, intermediate assemblies C1, C2, C3 formed of the respective first through third LDs 21 to 23 and the respective first through third sub-mounts 61 to 63 are made.

Subsequently, the intermediate assemblies C1 to C3 are fixed by being bonded to the first surface 113a of the base member 113 by, for example, the Ag paste so as to meet the following three requirements.

(a) The second and third LDs 22, 23 emit the respective second and third laser beams L2, L3 in the respective directions (or along their respective optical axes) orthogonal to the direction (or the optical axis) of the first laser beam L1 emitted from the first LD 21.

(b) The second and third LDs 22, 23 are disposed on the same side of the optical axis of the first LD 21.

(c) The second and third LDs 22, 23 are disposed in the direction of the optical axis of the first LD 21 from a side close to the first LD 21 in the order named.

The following may include cases where the Y direction and the Z direction are used for explanation with the direction of the optical axis of the first LD 21 being the X direction in a manner similar to the structural description of the optical module 1.

The first through third sub-mounts 61 to 63 may be mounted first on the first surface 113a of the base member 113. Thereafter, the first through third LDs 21 to 23 may be mounted on the respective primary surfaces 61a to 63a of the first through third sub-mounts 61 to 63, and finally, electric conduction may be ensured by wire bonding between the first through third sub-mounts 61 to 63 and the respective first through third LDs 21 to 23. In this case, a process temperature at which the first through third sub-mounts 61 to 63 are mounted on the first surface 113a can be not lower than a process temperature at which the first through third LDs 21 to 23 are mounted on the respective primary surfaces 61a to 63a, and the process temperature at which the first through third LDs 21 to 23 are mounted on the respective primary surfaces 61a to 63a can be not lower than a process temperature at which the wire bonding is carried out.

With the process temperature at which the first through third sub-mounts 61 to 63 are mounted on the first surface 113a being not lower than the process temperature at which the first through third LDs 21 to 23 are mounted on the respective primary surfaces 61a to 63a as described above, respective displacements of the first through third sub-mounts 61 to 63 can be avoided when the first through third LDs 21 to 23 axe mounted. With the process temperature at which the first through third LDs 21 to 23 are mounted on the respective primary surfaces 61a to 63a being not lower than the process temperature at which the wire bonding is carried out, respective displacements of the first through third LDs 21 to 23 can be avoided when the wire bonding is carried out.

Figure 7:
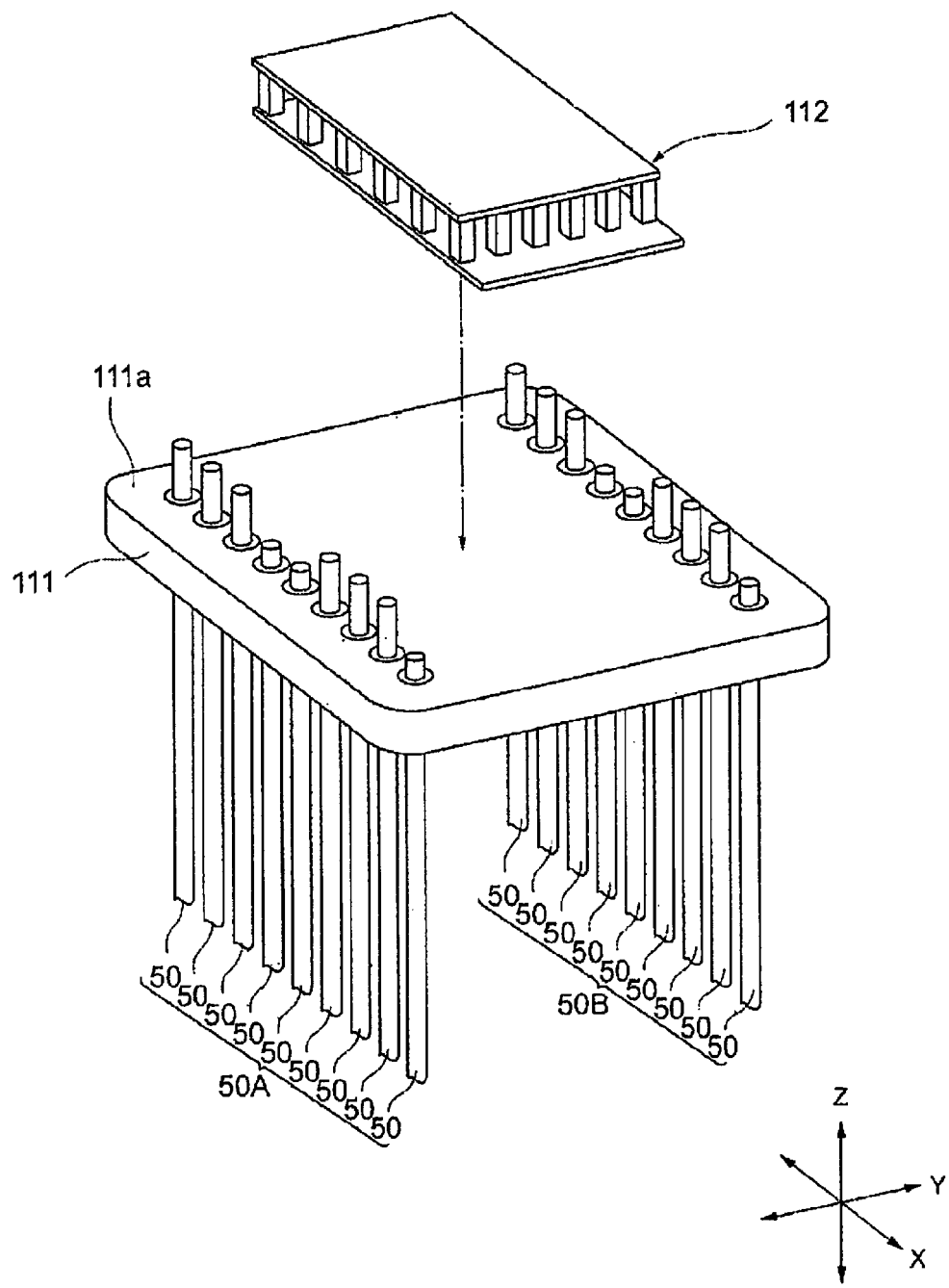
FIG. 7 illustrates a step of mounting a TEC (temperature control element) to the base member.
Figure 8:
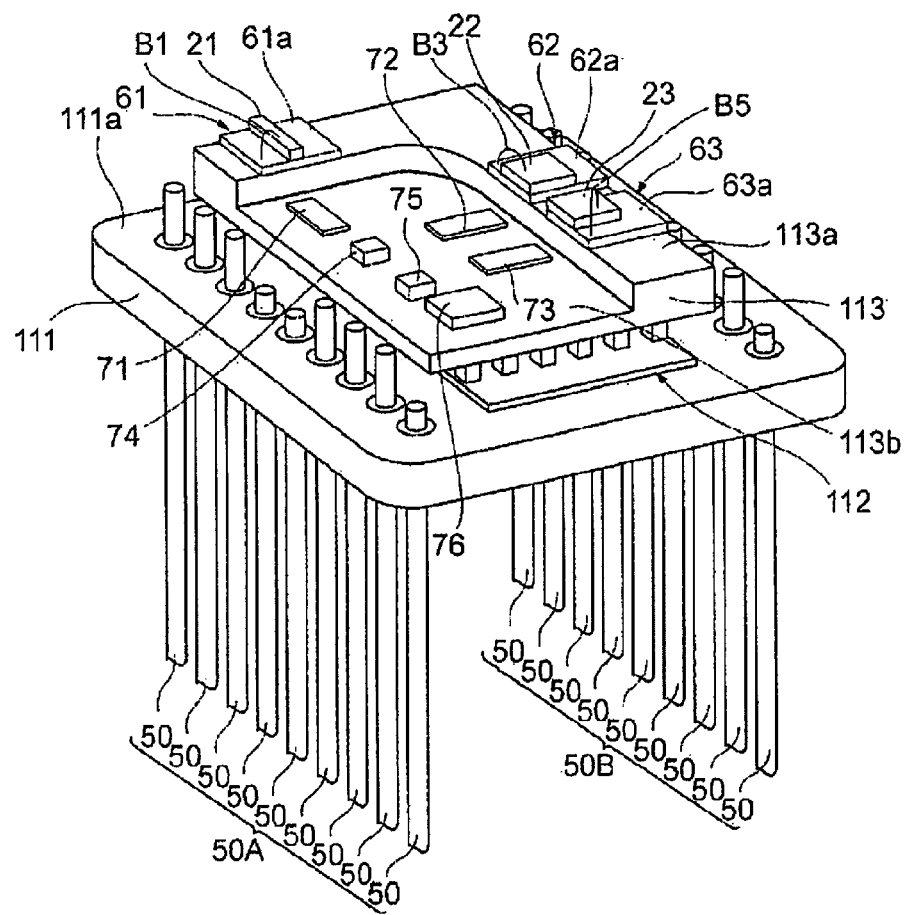
FIG. 8 illustrates a state in which the base member is mounted on the TEC.

Simultaneously with the above-described mounting of the first through third sub-mounts 61 to 63 and the first through third LDs 21 to 23, the TEC 112 is mounted on the primary surface 111a of the stem 111 as shown in FIG. 7. The TEC 112 is joined to the primary surface 111a by, for example, the Ag paste. After the TEC 112 is mounted on the primary surface 111a, the base member 113 is mounted on the surface 112b of the TEC 112 as shown in FIG. 8. The base member 113 is joined to the surface 112b by, for example, the Ag paste.

Figure 9:
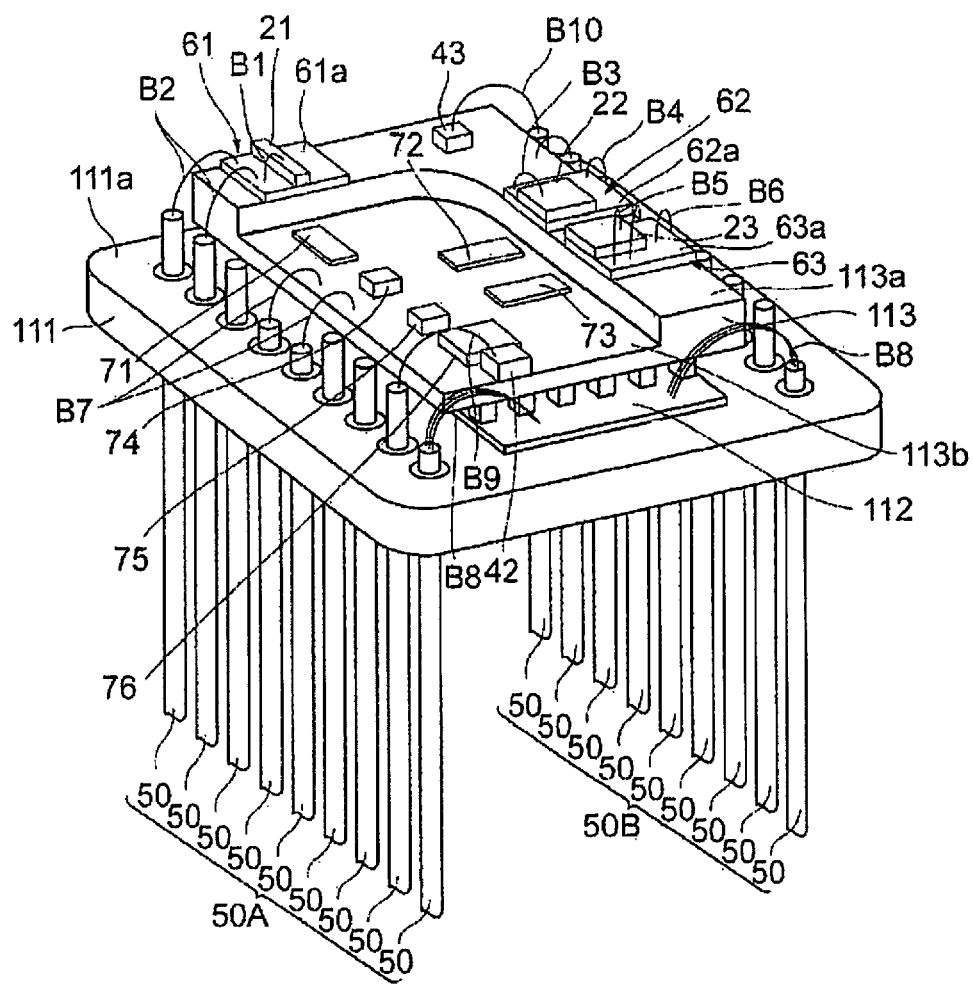
FIG. 9 illustrates a step subsequent to FIG. 8.

After the base member 113 is mounted on the surface 112b of the TEC 112, as shown in FIG. 9, the PD 42 and the thermistor 43 are mounted on the second surface 113b and the first surface 113a of the base member 113, respectively. After that, wiring including wire bonding between the lead pins 50 and the wiring pad on the base member 113, wire bonding between the lead pins 50 and the wiring pad of the TEC 112, and wire bonding between the lead pins 50 and the first through third sub-mounts 61 to 63 is carried out.

Here, a process temperature at which the TEC 112 is mounted on the primary surface 111a of the stem 111, such as an Ag paste firing temperature, is not lower than a process temperature at which the base member 113 is mounted on the surface 112b of the TEC 112. The process temperature at which the base member 113 is mounted on the surface 112b can be not lower than a process temperature at which the above wire bondings are carried out.

With the process temperature at which the TEC 112 is mounted on the primary surface 111a being not lower than the process temperature at which the base member 113 is mounted on the surface 112b, a displacement of the TEC 112 can be avoided when the base member 113 is mounted. With the process temperature at which the base member 113 is mounted on the surface 112b being not lower than the process temperature at which the wire bondings are carried out, a displacement of the base member 113 can be avoided when the wire bondings are carried out.

Figure 10:
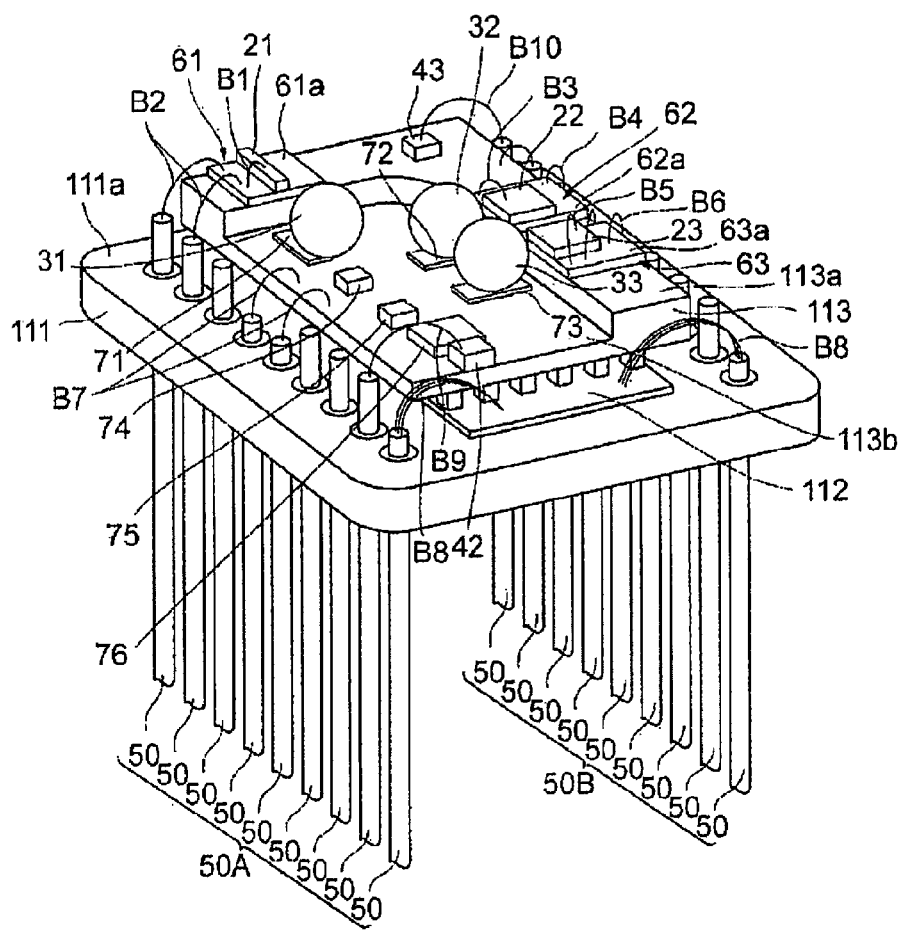
FIG. 10 illustrates a state in which a first through a third collimator lens are mounted above the base member.

Next, as shown in FIG. 10, the first through third collimator lenses 31 to 33 are mounted to the base member 113 with their respective optical axes adjusted.

When the first through third collimator lenses 31 to 33 are mounted to the base member 113, respective positions of the first through third collimator lenses 31 to 33 are adjusted while respective projection patterns of light beams emitted from the respective first through third collimator lenses 31 to 33 are observed. In this way, the first through third collimator lenses 31 to 33 are optically aligned.

Figure 11:
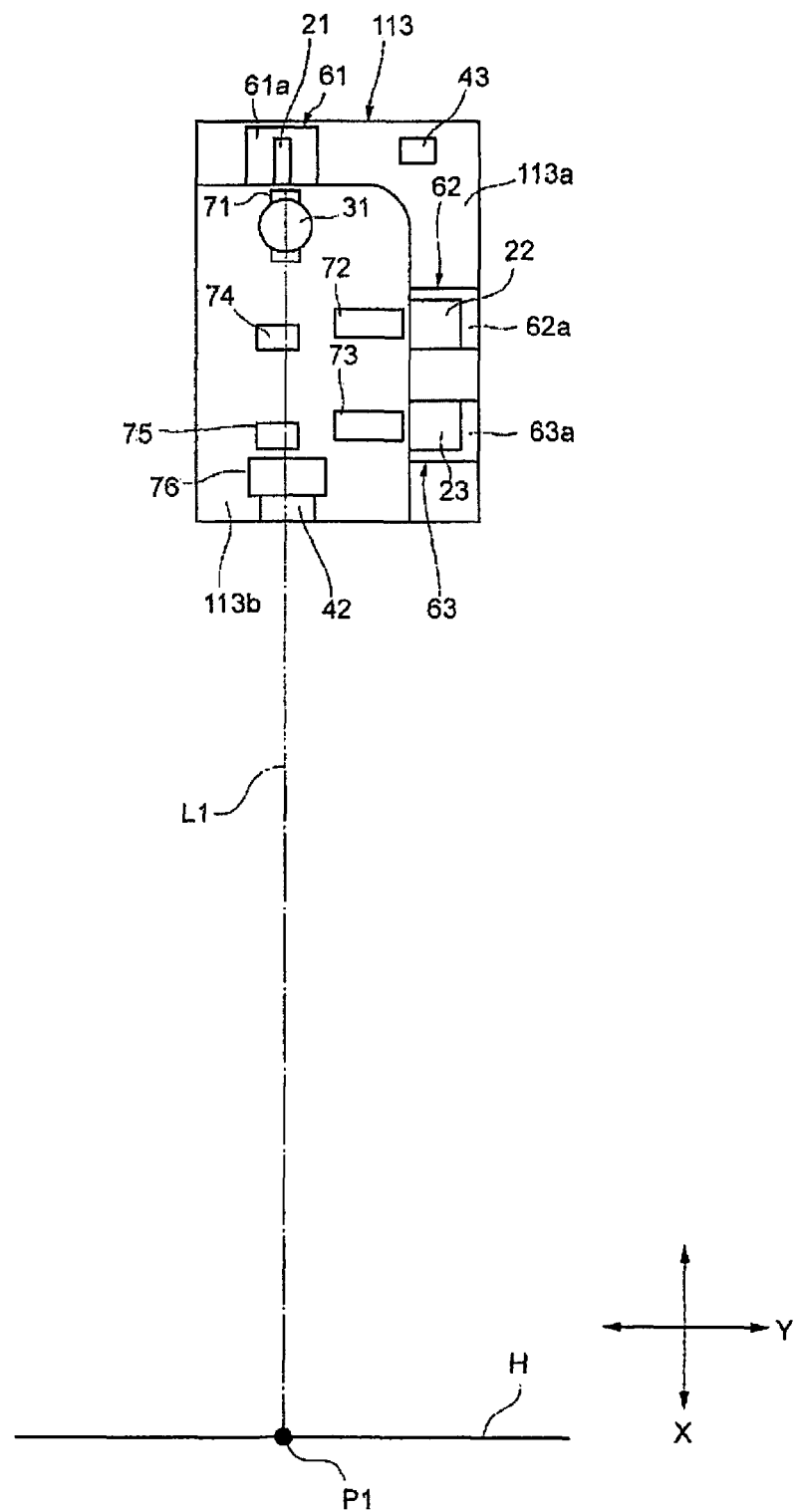
FIG. 11 illustrates a step of adjusting an optical axis of the first collimator lens.
Figure 12:
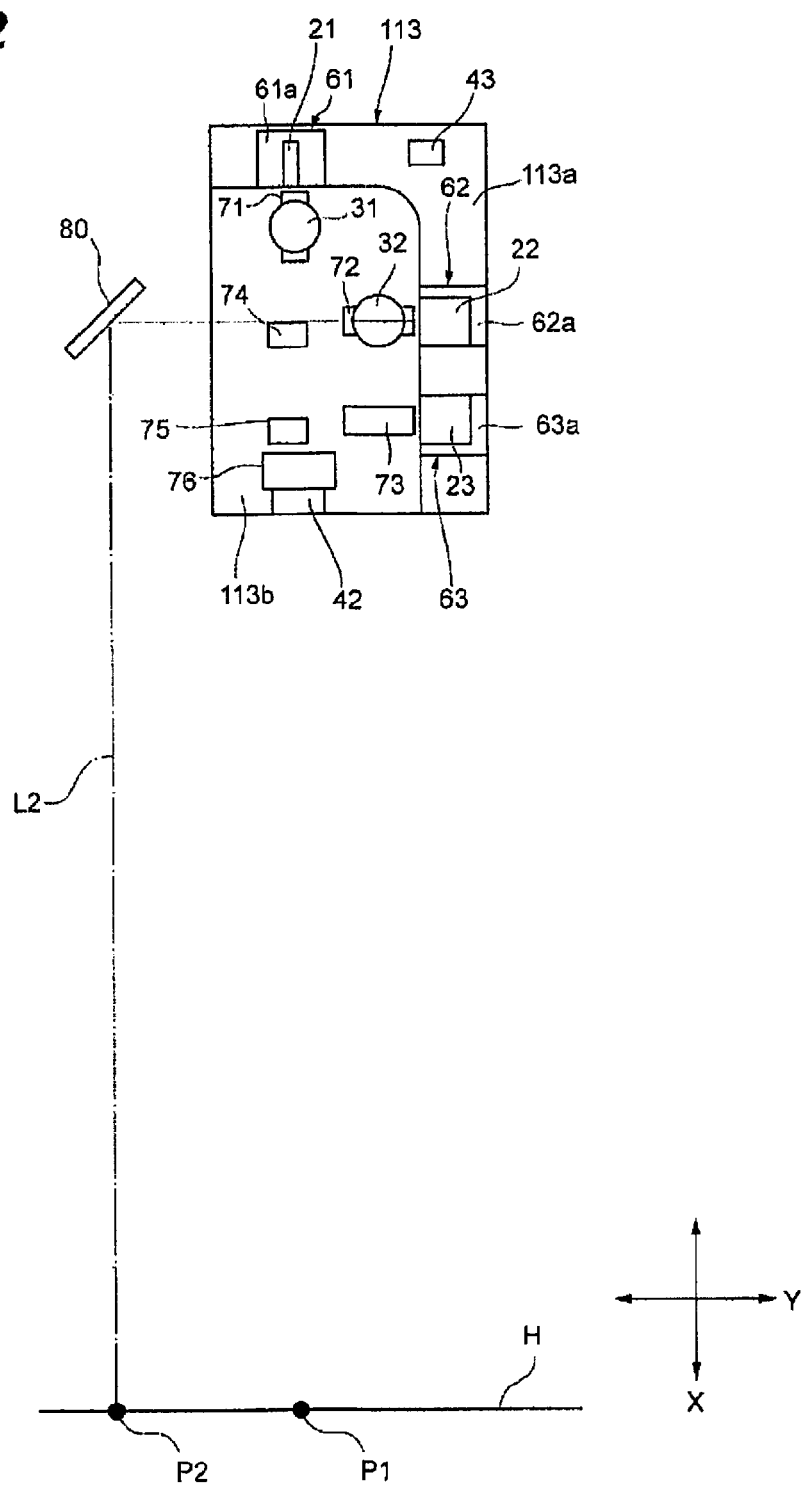
FIG. 12 illustrates a step of adjusting an optical axis of the second collimator lens.
Figure 13:
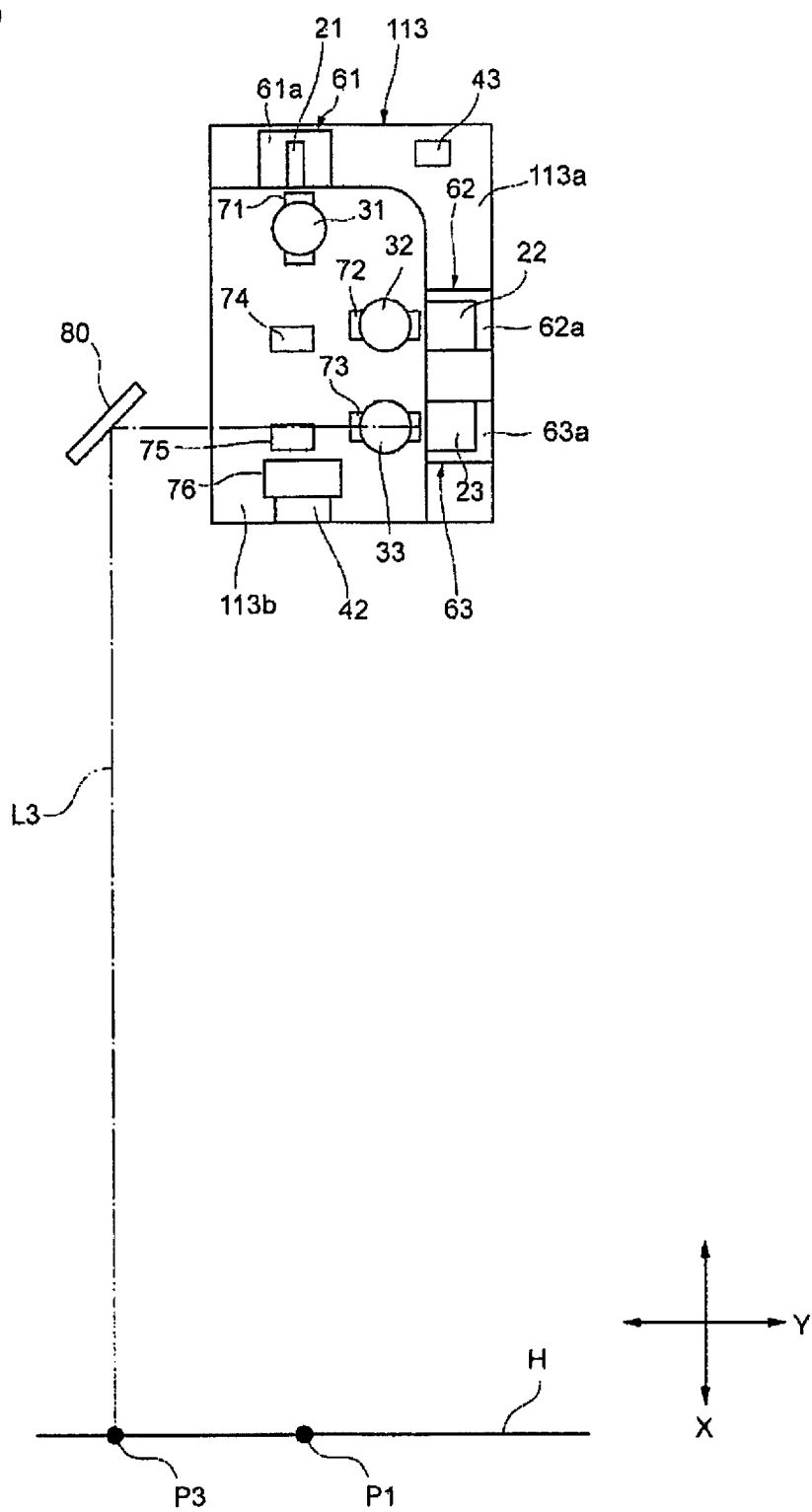
FIG. 13 illustrates a step of adjusting an optical axis of the third collimator lens.

When the respective positions of the first through third collimator lenses 31 to 33 are adjusted, a confirmation is made as to whether the light beams emitted from the respective first through third collimator lenses 31 to 33 are collimated. If the collimation is degraded (or poor), aberrations (such as astigmatism and spherical aberration) become greater for the second resultant light beam ML2 of the first through third laser beams L1, L2, L3, thus possibly causing a problem such as a decline in image quality. To maintain high-quality collimation, the first through third collimator lenses 31 to 33 undergo optical alignment (optical axis adjustment) in the following procedure in the first embodiment. Using FIGS. 11 to 13, a description is provided of a method of optical axis adjustment. FIGS. 11 to 13 schematically illustrate the structure on the base member 113.

First, the position of the first collimator lens 31 relative to the first LD 21 is determined as shown in FIG. 11. Here, the first collimator lens 31 is mounted to the second surface 113b of the base member 113 via the first sub-base member 71. While the first LD 21 is caused to perform light emission, the first collimator lens 31 is disposed on the first sub-base member 71. The first laser beam L1 emitted here from the first LD 21 travels in a straight line along a direction of emission from the first LD 21 without being reflected. In this case, the first collimator lens 31 is disposed so that the first laser beam L1 is projected onto a first projection point P1 positioned on a virtual plane H perpendicular to the first surface 113a. The virtual plane H can be disposed, for example, in a front position spaced a predetermined distance (for example, in a range of from 1 m to 2 m) away from the light emission end face of the first L1) 21.

Vertical adjustment of the first collimator lens 31 is also carried out so that the optical axis of the first laser beam L1 is substantially parallel to the first surface 113a (or the second surface 113b) of the base member 113. Here, with the ultraviolet curable resin, for example applied to the first sub-base member 71 in an ensured thickness, the first collimator lens 31 is held by suction by a collet or the like, and the collet is adjusted vertically (in the Z direction or in the thickness direction of the stem 111). In this way, a tilt angle which the first laser beam L1 makes with the first surface 113a (or the second surface 113b) is adjusted.

And then, an image sensor such as a CCD, which is a two-dimensional sensor, is disposed in the position spaced the predetermined distance (for example, in the range of from 1 m to 2 m) away from the light emission end face of the first LD 21 along the direction of the optical axis of the first LD 21, that is, in the position of the virtual plane H. While a beam diameter of the first laser beam L1 projected on the image sensor is observed, alignment is performed on the first collimator lens 31 to bring one focal point of the first collimator lens 31 into alignment with the light emission end face of the first LD 21. With the focal point of the first collimator lens 31 thus brought into alignment with the light emission end face of the first LD 21, the first laser beam L1 output by the first collimator lens 31 becomes a substantially collimated light beam.

In cases where a distance between the first collimator lens 31 and the light emission end face of the first LD 21 is shorter than the focal length of the first collimator lens 31, the first laser beam L1 emitted from the first collimator lens 31 becomes a divergent light beam. In cases where the distance between the first collimator lens 31 and the above-mentioned light emission end face is longer than the above-mentioned focal length, the first laser beam L1 emitted from the first collimator lens 31 becomes a convergent light beam.

However, in the first embodiment, the focal point of the first collimator lens 31 is brought into alignment with the light emission end face of the first LD 21 as described above, so that the first laser beam L1 emitted from the first collimator lens 31 is a substantially collimated light flux, whereby the projection pattern can be observed even in the position several meters away. After the focal point of the first collimator lens 31 is brought into alignment with the light emission end face of the first LD 21 as described above, the ultraviolet curable resin on the first sub-base member 71 is cured to fix the first collimator lens 31 on the first sub-base member 71.

Next, as shown in FIG. 12, the position of the second collimator lens 32 relative to the second LD 22 is determined. Here, the second collimator lens 32 is mounted to the second surface 113b of the base member 113 via the second sub-base member 72. The second collimator lens 32 is disposed so that the second laser beam L2 is projected onto a second projection point P2 positioned on the virtual plane 11. The second projection point P2 and the first projection point P1 are at the same level above the first surface 113a of the base member 113.

Specifically, an alignment mirror 80 having a reflection surface perpendicular to the first surface 113a is disposed on the optical axis of the second LD 22 so that its reflection surface makes an angle of 45 degrees with the optical axis of the first LD 21. The second LD 22 is then caused to perform light emission. Here, the second laser beam L2 is projected onto the virtual plane H. Subsequently, vertical adjustment of the second collimator lens 32 is carried out so that the optical axis of the second LD 22 is substantially parallel to the first surface 113a (or the second surface 113b) of the base member 113. Here, with the ultraviolet curable resin, for example applied to the second sub-base member 72 in an ensured thickness, the second collimator lens 32 is held by suction by a collet or the like, and the collet is adjusted vertically. In this way, a tilt angle which the second laser beam L2 makes with the first surface 113a (or the second surface 113b) is adjusted. In the vertical adjustment of the second collimator lens 32, the second projection point P2 is at the same level above the first surface 113a as the first projection point P1 of the first laser beam L1.

While, through use of, for example, the image sensor that is disposed on the virtual plane H for the alignment between the first LD 21 and the first collimator lens 31, a beam diameter of the second laser beam L2 projected on the image sensor is observed, alignment is performed on the second collimator lens 32 to bring one focal point of the second collimator lens 32 into alignment with the light emission end face of the second LD 22. With the focal point of the second collimator lens 32 thus brought into alignment with the light emission end face of the second LD 22, the second laser beam L2 output by the second collimator lens 32 becomes a substantially collimated light beam.

Subsequently, as shown in FIG. 13, the position of the third collimator lens 33 relative to the third LD 23 is determined. First, the third collimator lens 33 is mounted to the second surface 113b of the base member 113 via the third sub-base member 73. In this case, the third collimator lens 33 is disposed so that the third laser beam L3 is projected onto a third projection point P3 positioned on the virtual plane H. The third projection point P3 and the first projection point P1 arc at the same level above the first surface 113a of the base member 113. In this step, the third collimator lens 33 is preferably disposed so that respective positions of the second and third projection points P2, P3 are in substantial agreement with each other.

Specifically, the alignment mirror 80 having the reflection surface perpendicular to the first surface 113a is disposed on the optical axis of the third laser beam L3 so that its reflection surface makes an angle of 45 degrees with the optical axis of the first LD 21. The third LD 23 is then caused to perform light emission. Here, the third laser beam L3 is projected onto the virtual plane H. Subsequently, vertical adjustment of the third collimator lens 33 is carried out so that the optical axis of the third laser beam L3 is substantially parallel to the first surface 113a (or the second surface 113b) of the base member 113. Here, with the ultraviolet curable resin, for example applied to the third sub-base member 73 in an ensured thickness, the third collimator lens 33 is held by suction by a collet or the like, and the collet is adjusted vertically. In this way, a tilt angle which the third laser beam L3 makes with the first surface 113a (or the second surface 113b) is adjusted. In the vertical adjustment of the third collimator lens 33, the third projection point P3 is at the same level above the first surface 113a as the first projection point P1 of the first laser beam L1 and is brought into substantial agreement in position with the second projection point P2 of the second laser beam L2.

While, through use of, for example, the image sensor that is disposed on the virtual plane H for the alignment between the first LD 21 and the first collimator lens 31, a beam diameter of the third laser beam L3 projected on the image sensor is observed, alignment is performed on the third collimator lens 33 to bring one focal point of the third collimator lens 33 into alignment with the light emission end face of the third LD 23. With the focal point of the third collimator lens 33 thus brought into alignment with the light emission end face of the third LD 23, the third laser beam L3 output by the third collimator lens 33 becomes a substantially collimated light beam.

Figure 14:
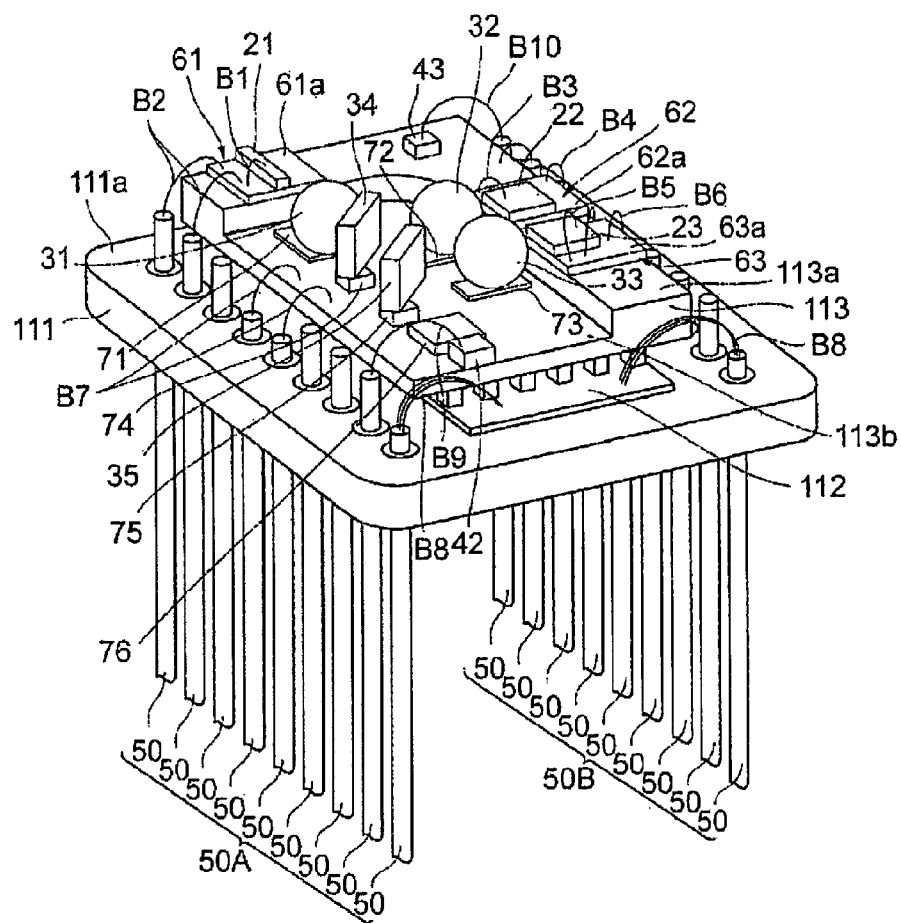
FIG. 14 illustrates a state in which a first and a second wavelength selective filter are mounted above the base member.
Figure 15:
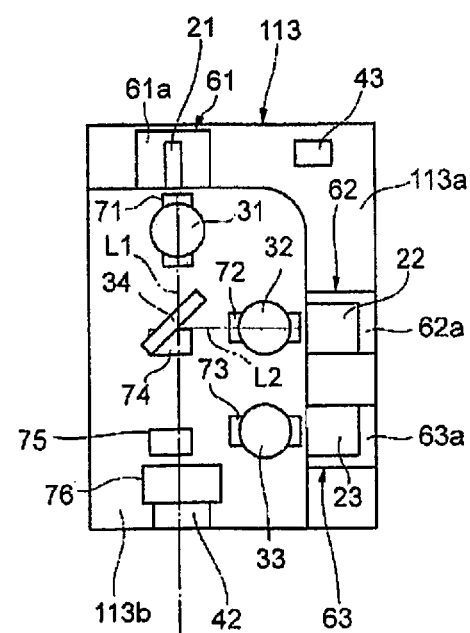
FIG. 15 illustrates a step of adjusting an optical axis of the first wavelength selective filter.
Figure 15:
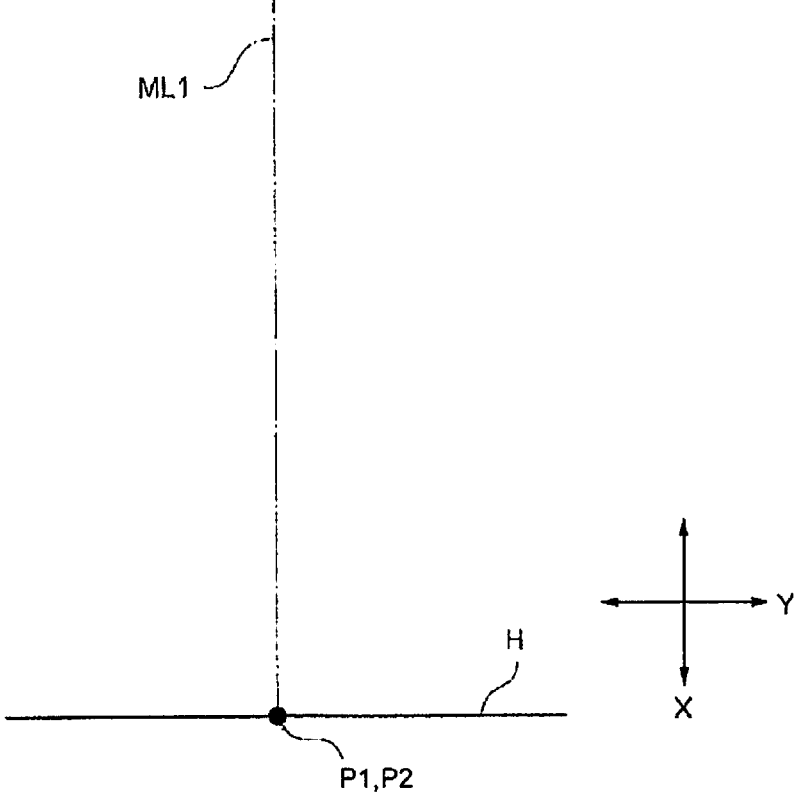
Figure 16:
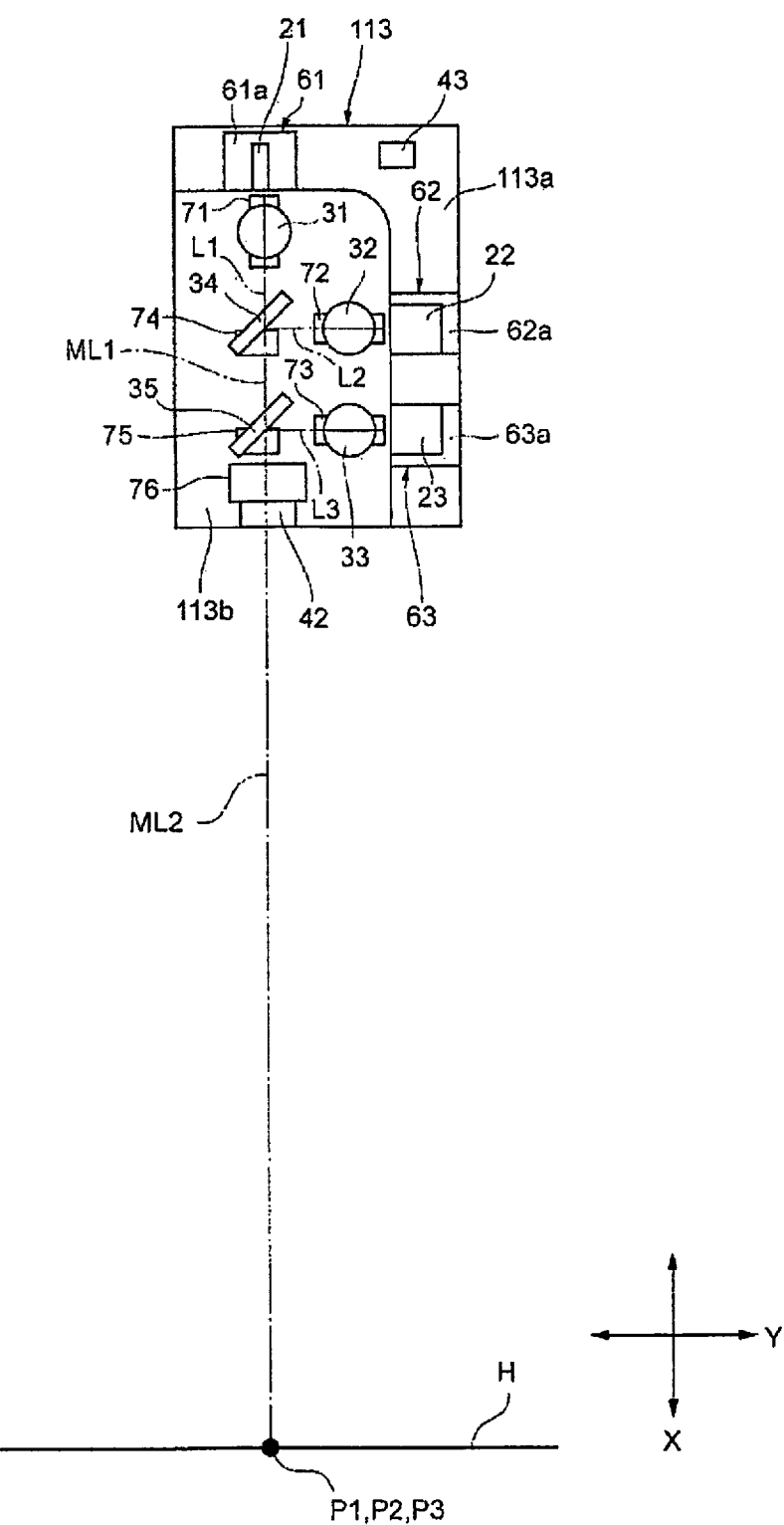
FIG. 16 illustrates a step of adjusting an optical axis of the second wavelength selective filter.

Next, as shown in FIG. 14, the first and second wavelength selective filters 34, 35 are mounted to the base member 113 with their respective optical axes adjusted. Referring to FIGS. 15 and 16, a description is provided of a method of optical axis adjustment of the first and second wavelength selective filters 34, 35.

As shown in FIG. 15, the first wavelength selective filter 34 is mounted to the second surface 113b of the base member 113. Here, an angle of the first wavelength selective filter 34 is adjusted so that the projection pattern of the second laser beam L2 on the image sensor used for the alignment of the first through third collimator lenses 31 to 33 is brought into substantial agreement with the projection pattern of the first laser beam L1.

Specifically, the first wavelength selective filter 34 is disposed on the optical axis of the second LD 22, and the second laser beam L2 is reflected by the first wavelength selective filter 34, thereby being projected onto a projection surface of the image sensor, such as the CCD, that is disposed in the position of the virtual plane H for use in the optical axis adjustment of the first through third collimator lenses 31 to 33. And then, a deflection angle and a tilt angle of the first wavelength selective filter 34 are adjusted to bring the projection pattern of the second laser beam L2 into substantial agreement with the projection pattern of the first laser beam L1. After the deflection angle and the tilt angle of the first wavelength selective filter 34 are adjusted for substantial agreement between the projection pattern of the second laser beam L2 and the projection pattern of the first laser beam L1, the ultraviolet curable resin on the fourth sub-base member 74 is cured to fix the first wavelength selective filter 34 on the fourth sub-base member 74.

Affected by a thickness of the first wavelength selective filter 34, the projection pattern of the first laser beam L1 undergoes slight parallel displacement. However, alignment can be carried out without any problems by bringing the projection pattern of the second laser beam L2 into substantial agreement with the projection pattern of the first laser beam L1 that has undergone the parallel displacement.

Subsequently, as shown in FIG. 16, the second wavelength selective filter 35 is mounted to the second surface 113b of the base member 113. Here, as in the case of the first wavelength selective filter 34, a deflection angle and a tilt angle of the second wavelength selective filter 35 are adjusted to bring the projection pattern of the third laser beam L3 into substantial agreement with the projection pattern of the first laser beam L1. Moreover, the second wavelength selective filter 35 is disposed so that its light reflection surface is parallel to a light reflection surface of the first wavelength selective filter 34. A concreate method of adjustment is similar to the above procedure for disposing the first wavelength selective filter 34.

Next, the mirror 41 is mounted to the second surface 113b of the base member 113. The mirror 41 is mounted above the second surface 113b with its slant face 41a making an angle of 45 degrees with the second surface 113b. The mirror 41 is fixed on the sixth sub-base member 76 by ultraviolet curable resin.

As a result of the above-described steps carried out, the optical component mounting assembly 2 (refer to FIG. 4) is obtained, having the first through third LDs 21 to 23, the first through third collimator lenses 31 to 33, the first and second wavelength selective filters 34, 35, and others mounted above the support 11 that has the stem 111, the TEC 112, and the base member 113. Although the ultraviolet curable resin is given as an example of fixing the first through third collimator lenses 31 to 33, any adhesive that is of a resin curing type may be used.

[Sealing Step]

In sealing step S20, first, the optical component mounting assembly 2 and the cap 12 are baked in a dry air atmosphere (baking step). A dew point of the dry air atmosphere, a baking temperature, and a baking time can be adjusted appropriately for achievement of a desired moisture content. The dew point is, for example, not more than −40° C., the baking temperature is, for example, not more than 90° C., and the baking time is, for example, in a range of from one hour to twelve hours. With the baking temperature being not more than 90° C., characteristics of the multiplexing optical system 30 can be prevented from being adversely affected by heat. In the embodiment, the optical component mounting assembly 2 and the cap 12 are placed in a dry air atmosphere with a dew point of −50° C. and are baked at a temperature of 80° C. for four hours.

After the baking step is carried out, the primary surface 111a of the stem 111 is covered with the cap 12 in a dry air atmosphere with the transmissive window 124 of the cap 12 positioned above the slant face 41a of the mirror 41 (oppositely to the base member 113), and the cap 12 is joined to the stem 111 by welding (joining step), whereby the package 10 is formed. Consequently, the optical module 1 is completed. A dew point of the dry air atmosphere is, for example, similar to that of the baking step. The cap 12 can be welded to the stem 111 by means of, for example, a resistance welding machine. However, the cap 12 may be joined to the stem 111 by any nonrestrictive welding or joining method, provided that the first through third LDs 21 to 23, the first through third collimator lenses 31 to 33, the first and second wavelength selective filters 34, 35 and others can be enclosed hermetically.

In the optical module 1, the first laser beam L1, the second laser beam L2, and the third laser beam L3 are emitted from the first LD 21, the second LD 22, and the third LD 23, respectively. These first through third laser beams L1, L2, L3 are collimated when passing through the first collimator lens 31, the second collimator lens 32, and the third collimator lens 33, respectively. The first laser beam L1 and the second laser beam L2 thereafter are combined by the first wavelength selective filter 34 to be emitted as the first resultant light beam ML1. Subsequently, the first resultant light beam ML1 and the third laser beam L3 are combined by the second wavelength selective filter 35 to be emitted as the second resultant light beam ML2. The second resultant light beam ML2 formed of the first laser beam L1, the second laser beam L2 and the third laser beam L3 is reflected by the slant face 41a of the mirror 41, thus being directed in a normal direction of the second surface 113b of the base member 113 and emitted out of the optical module 1 through the transmissive window 124.

In the optical module 1, the multiplexing optical system 30 is fixed to the support 11 through use of the resin curing adhesive. Specifically, the first through third collimator lenses 31 to 33 and the first and second wavelength selective filters 34, 35 are fixed on the respective first through fifth sub-base members 71 to 75 of the base member 113, which is a part of the support 11, by the resin curing adhesive.

The use of the resin-based adhesive for fixing the optical components such as the first through third collimator lenses 31 to 33 and the first and second wavelength selective filters 34, 35 within the package 10, the internal space $S_{10}$ of which has the volume of not less than 200 mm$^3$, enables improved productivity and reduced manufacturing costs.

However, the above resin-based adhesive is known as a source of contamination of an LD (hereinafter referred to as "LD of interest" for convenience of explanation) that has an oscillation wavelength of not more than 550 nm in an optical module having the LD of interest hermetically enclosed in a package. In other words, a phenomenon known as a dust collection effect readily takes place. This phenomenon is such that substances released from the resin-based adhesive remaining inside the package are decomposed by a high-energy laser beam output from the LD of interest that has the oscillation wavelength of not more than 550 nm and result in adhesion to an emission end face of the LD of interest. When such a dust collection effect takes place, laser beam output of the LD of interest is degraded, and consequently, the optical module has reduced reliability. To avoid this, use of an adhesive that does not become a source of contamination (such as flux-free solder or an adhesive not containing Si-based organic substances, either of which is described in the Patent Document 1) or the like is conceivable but increases manufacturing costs of the optical module. As compared with the resin curing adhesive, the adhesive that does not become the source of contamination complicates a bonding step and also requires time for bonding. As a result, productivity of the optical module reduces.

The productivity of the optical module reduces further particularly when a plurality of LDs, a correspondingly increased number of lenses, and a correspondingly increased number of wavelength selective filters are provided inside the package.

On the other hand, inventors of the present invention have found that the dust collection effect can be reduced on condition that the internal moisture content of the package 10 is not more than 3000 ppm. In the optical module 1, the internal moisture content of the package 10 is not more than 3000 ppm, so that even when the resin curing adhesive is used, output degradation of the third LD 23 is not readily caused by the dust collection effect. In addition, the resin curing adhesive can be lower in cost than the above-mentioned adhesive, which does not become the source of contamination in the dust collection effect. As compared with the adhesive that does not become the source of contamination in the dust collection effect, the resin curing adhesive simplifies the bonding step and can shorten the bonding time. Accordingly, the optical module 1 is susceptible of both improvement in productivity and reduction in manufacturing costs. Furthermore, the optical module 1 can have its reliability prevented from being deteriorated because the dust collection effect is reduced. Because the less the moisture content, the more the reduction of the dust collection effect, with the moisture content being not more than 2000 ppm or not more than 1000 ppm, further prevention of the reliability deterioration of the optical module 1, further improvement of the productivity, and further reduction of the manufacturing costs can be achieved.

The optical module 1 having the above moisture content can be realized by, as explained in the method for manufacturing the optical module 1, subsequent to the production of the optical component mounting assembly 2, baking the optical component mounting assembly 2 and the cap 12 in a predetermined dry air atmosphere, and joining the cap 12 to the support 11 in a dry air atmosphere. Since the multiplexing optical system 30 is bonded to the support 11 by the resin curing adhesive, the step of bonding the multiplexing optical system 30 to the support 11 is simple and easy. Thus, the method for manufacturing the optical module 1 enables improved productivity and reduced manufacturing costs.

In the optical module 1, the first through third LDs 21 to 23 are provided to the base member 113, which is a component of the support 11, via the respective first through third sub-mounts 61 to 63. In the embodiment, the first through third sub-mounts 61 to 63 are bonded to the base member 113 by means of the Ag paste. Although the Ag paste can also become a source of contamination in the dust collection effect, the internal moisture content of the package 10 is not more than 3000 ppm, so that the degradation of the LD of interest can be reduced. Consequently, the optical module 1 can have its reliability prevented from being deteriorated. The use of the adhesive that does not become the source of contamination in the dust collection effect in place of the Ag paste increases the manufacturing costs, whereas the use of the Ag paste enables further reduction of the manufacturing costs of the optical module 1. In cases where the Ag paste is used, after the first through third sub-mounts 61 to 63 are disposed at predetermined positions, baking may be carried out to remove flux, thus bonding the first through third sub-mounts 61 to 63 to the support 11. Therefore, in cases where the optical module 1 has a plurality of components such as the first through third sub-mounts 61 to 63 corresponding to the respective first through third LDs 21 to 23, improvement is also achieved in productivity. Although the Ag paste has been given as the example of the conductive adhesive for bonding the first through third sub-mounts 61 to 63, conductive adhesives other than the Ag paste can also provide similar functional effects. Those conductive adhesives other than the Ag paste can include carbon (C) paste and copper (Cu) paste. However, from the viewpoints of volume resistivity and connection resistance, the Ag paste is preferable.

The above-described dust collection effect tends to become conspicuous with a shorter wavelength or with a high-energy laser beam. Accordingly, the structure of the optical module 1 is more effective when including an LD (such as a bluish purple LD) that has an oscillation wavelength in a range of from 390 nm to 420 nm or the LD (such as the blue LD) that is illustrated in FIG. 1 and others as the third LD 23 having the oscillation wavelength in the range of from 435 nm to 465 nm.

In cases where the moisture absorbent 13 is included in the optical module 1, the internal moisture content of the package 10 can be decreased further. Disposing the moisture absorbent 13 on the inner wall of the cap 12 eliminates use of space on the base member 113 for the moisture absorbent 13, so that enough space can be secured on the base member 113 for the optical components (including the first through third collimator lenses 31 to 33) with the moisture absorbent 13 disposed, for example, near the third LD 23. With the internal space $S_{10}$ of the package 10 of the optical module 1 being not less than 200 mm³, an area for the moisture absorbent 13 on the inner wall of the cap 12 is easy to secure.

In the optical module 1, the base member 113 is mounted with the first LD 21, the second LD 22, the third LD 23, the first collimator lens 31, the second collimator lens 32, the third collimator lens 33, the first wavelength selective filter 34, and the second wavelength selective filter 35 and is mounted on the TEC 112. Thus, through temperature control of the TEC 112 by means of an Automatic Temperature Controller (ATC), the first LD 21, the second LD 22, and the third LD 23 are maintained at their constant temperatures. Accordingly, constant light-emitting characteristics of the first LD 21, the second LD 22, and the third LD 23 can be maintained, not being susceptible to an ambient or environmental temperature.

With the first through third LDs 21 to 23 maintained at their constant temperatures by the TEC 112, variations in optical coupling can be reduced between the first through third LDs 21 to 23 and the respective first through third collimator lenses 31 to 33. High collimation can thus be maintained for the first through third laser beams L1, L2, L3 emitted from the respective first through third collimator lenses 31 to 33. Consequently, in cases where the second resultant light beam ML2 is focused on an optical system (such as a scanning optical system) coupled to a rear stage (a side from which the second resultant light beam ML2 is output) of the optical module 1, astigmatism and spherical aberration can be reduced significantly, whereby the possibility of a color blur can be reduced.

In the optical module 1, the first through third collimator lenses 31 to 33 are disposed to correspond to the respective first through third LDs 21 to 23 and are mounted to the second surface 113b of the base member 113 via the respective first through third sub-base members 71 to 73 that are independent of one another. Such a structure can prevent one of the resin curing adhesives used for fixing the respective first through third collimator lenses 31 to 33 from flowing from its position into another fixing position for the first, second or third collimator lens 31, 32 or 33. Accordingly, respective variations of the optical axes of the first through third laser beams L1, L2, L3 that are emitted from the respective first through third LDs 21 to 23 can be reduced, whereby the optical axis adjustment can be carried out with high accuracy.

In the manufacture of the optical module 1, the optical axis adjustment of the multiplexing optical system 30 can be carried out by referring to, for example, FIGS. 11 to 13 and FIGS. 15 and 16. In other words, the optical axis adjustment can be carried out through use of the image sensor disposed in the position that is spaced the predetermined distance (for example, in the range of from 1 m or 2 m) away from the emission end face of the first LD 21 along the direction of the optical axis of the first LD 21. In the optical module 1 that has undergone such an optical axis adjustment, the optical axes of the first through third laser beams L1 to L3 included in the second resultant light beam ML2 are in alignment right after emission from the multiplexing optical system 30 and are in substantial alignment even in the position that is spaced the predetermined distance (for example, 1 m or 2 m) away from the emission end face of the first LD 21 along a traveling direction (or in an optical path) of the first laser beam L1 emitted from the first LD 21. Thus, the optical module 1 can output the second resultant light beam ML2 that has its optical axis adjusted with higher accuracy.

In cases where the focal length of each of the first through third collimator lenses 31 to 33 is less than 5 mm in particular, optical axis adjustment is known to be difficult because of being susceptible to, for example, misalignment of optical components. However, with the optical axis adjustment carried out, for example, in the method described with reference to FIGS. 11 to 13 and FIGS. 15 and 16, the second resultant light beam ML2 that has its optical axis adjusted with higher accuracy can be output as described above.

Second Embodiment

Figure 17:
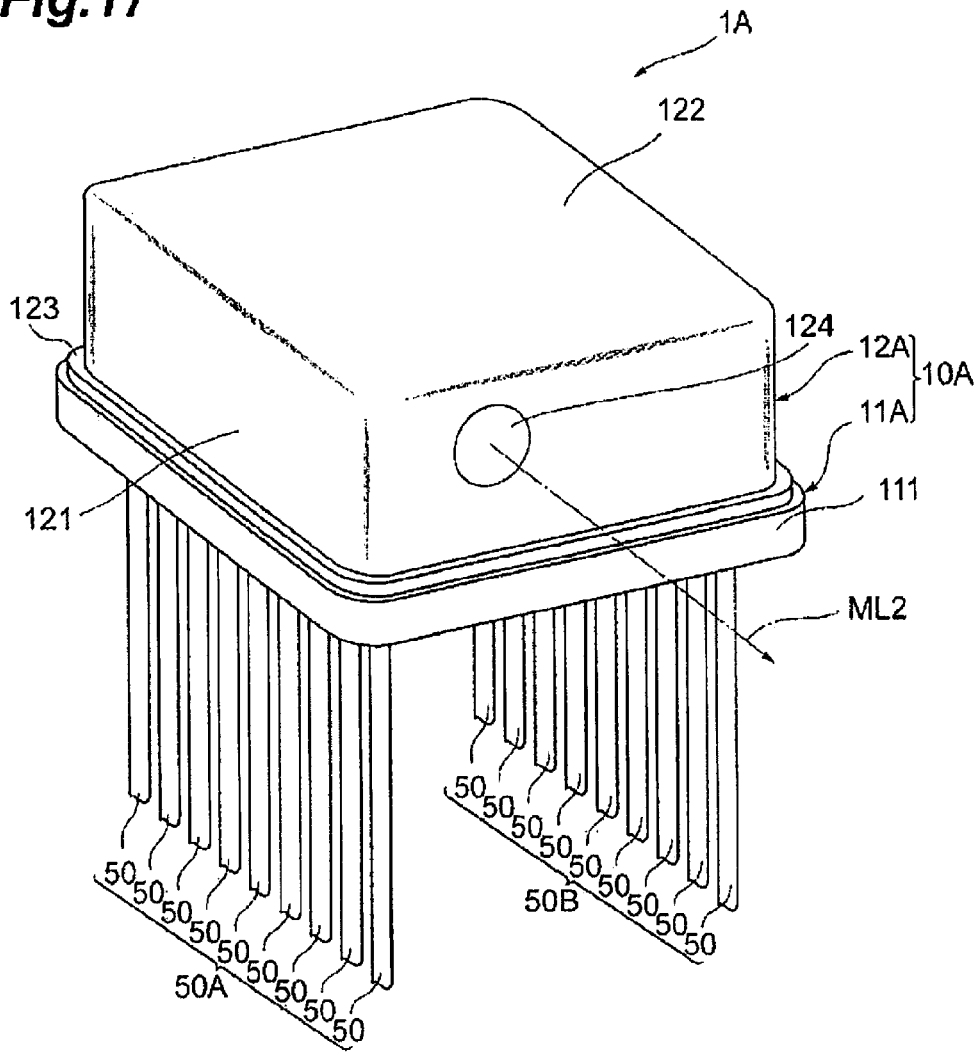
FIG. 17 is a perspective view of an illustrative optical module according to a second embodiment.
Figure 18:
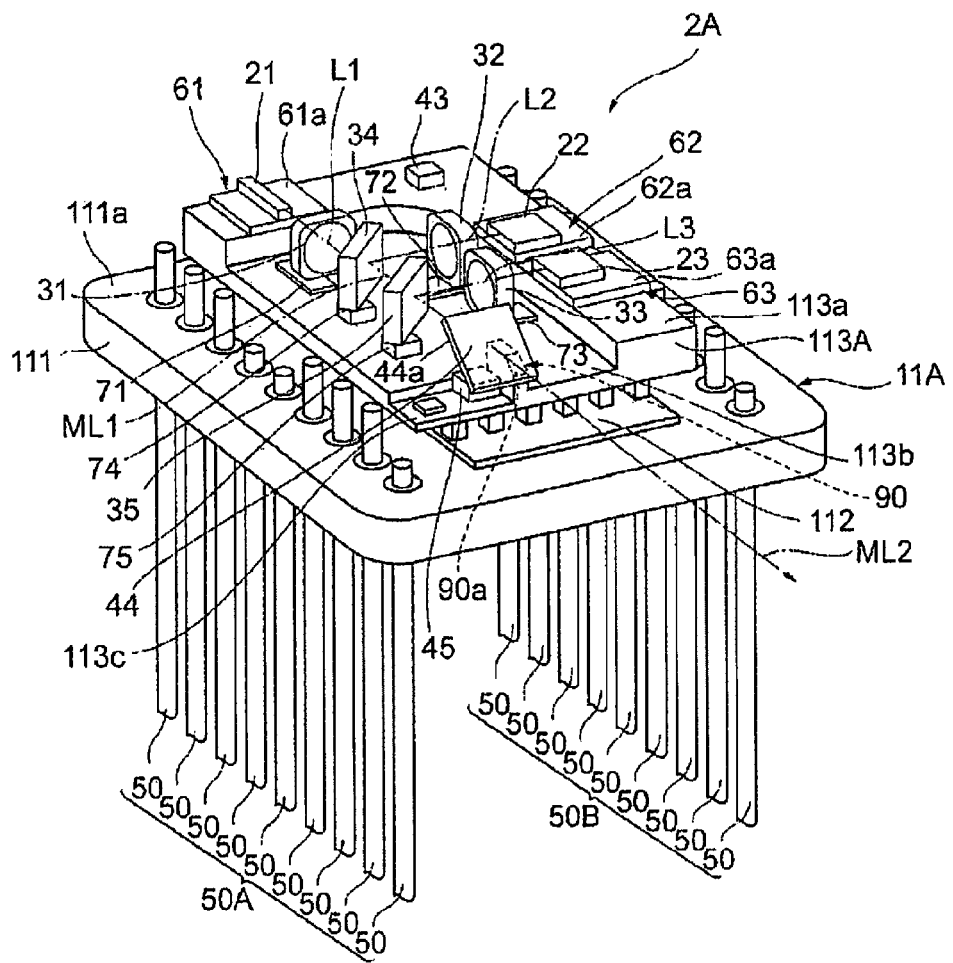
FIG. 18 is a perspective view of an optical component mounting assembly, illustrating the optical module of FIG. 17 with a cap removed.

Next, an optical module 1A according to the second embodiment is described. FIG. 17 is an external view in perspective of the optical module 1A, and FIG. 18 is a perspective view illustrating the optical module 1A with a cap 12A removed therefrom. As shown in FIG. 18, the optical module 1A with the cap 12A removed is referred to as an optical component mounting assembly 2A as in the case of the first embodiment. In FIG. 18, illustrations of some parts including bonding wires B1 to B10 are omitted for convenience.

As shown in FIGS. 17 and 18, the optical module 1A emits a second resultant light beam ML2 in a direction different from that of the first embodiment. Because of this, the optical module 1A includes a package 10A instead of a package 10 and includes a beam splitter 44 and a PD 45 instead of a mirror 41 and a PD 42.

The package 10A includes a support 11A and the cap 12A. The cap 12A is similar in structure to a cap 12, except that a transmissive window 124 is provided in a tubular part 121.

The support 11A is similar in structure to a support 11, except that the support 11A has a base member 113A instead of a base member 113. The base member 113A is similar in structure to the base member 113, except that the base member 113A includes a mount 90 for the beam splitter 44, does not have a sixth sub-base member 76 and further includes a third surface 113c on which the PD 45 is disposed.

The mount 90 is provided on the base member 113A at an end that is opposite to a first LD 21 along a direction (X direction in FIG. 18) of an optical axis of the first LD 21. The third surface 113c is formed at a corner of the base member 113A. The base member 113A defines this corner formed with the third surface 113c between its end where the mount 90 is disposed and its end opposite to its side along which a second and a third LD 22, 23 are disposed. The third surface 113c is at a lower level than a second surface 113b.

The beam splitter 44 is held while making contact in inclined condition with a slant face 90a of the mount 90 of the base member 113A. The beam splitter 44 is fixed to the mount 90 by, for example, a resin curing adhesive. The beam splitter 44 has a slant face 44a, and this slant face 44a makes an angle of 45 degrees with the second surface 113b of the base member 113A. The PD 45 is disposed below the slant face 44a on the third surface 113c.

The slant face 44a of the beam splitter 44 has, for example, a dielectric multilayer film affixed thereto, thus having a function of reflecting a portion of the second resultant light beam ML2 downward. In other words, the beam splitter 44 reflects in the downward direction (toward the third surface 113c) the portion of the second resultant light beam ML2 emitted from a second wavelength selective filter 35 and transmits the remainder. In this way, the slant face 44a functions as a reflection surface that reflects the portion of the first through third laser beam L1, L2, L3, The first through third laser beams L1, L2, L3 that is reflected downward by the slant face 44a is incident on the PD 45. The PD 45 is capable of detecting intensity of the second resultant light beam ML2 by receiving the light reflected off the slant face 44a of the beam splitter 44.

Even in the optical module 1A, a moisture absorbent 13 may be provided inside the cap 12A. An example of a position in which the moisture absorbent 13 is disposed is similar to that of the first embodiment.

The thus-constructed optical module 1A of the second embodiment is similar in structure to an optical module 1, except that the optical module 1A has the second resultant light beam ML2 emitted in the direction different from that of the first embodiment and has the above-described structural differences associated with this. This means that the even in the optical module 1A, the package 10A has an internal moisture content of not more than 3000 ppm, whereby even the optical module 1A obtains at least effects similar to those of the optical module 1 of the first embodiment. For example, the optical module 1A can have its reliability prevented from being deteriorated because the internal moisture content of its package 10A is not more than 3000 ppm, thus enabling improved productivity and reduced manufacturing costs.

(Illustrative Experiment)

Referring to an illustrative experiment, a description is provided next of reduction of output degradation of an LD having an oscillation wavelength of not more than 550 nm in an optical module when a package of the optical module has an internal moisture content of not more than 3000 ppm. Optical modules used in the experiment are referred to as optical modules E1, E2, E3, E4, respectively as shown in FIG. 19.

Figure 19:
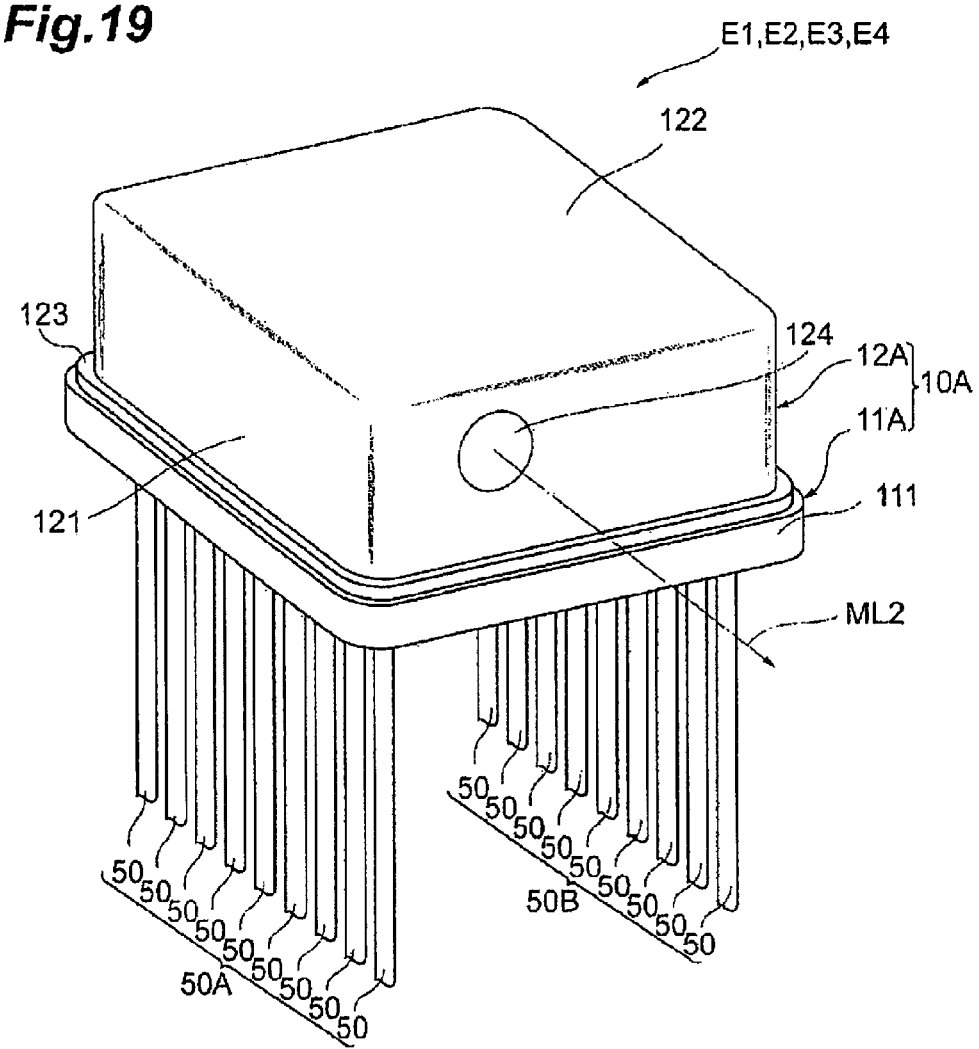
FIG. 19 is a perspective view of an optical module used in an illustrative experiment.

As shown in FIG. 19, the optical modules E1, E2, E4 are each similar in structure to the optical module 1A shown in FIGS. 17 and 18, except that their manufacturing conditions are different. Accordingly, in descriptions of the optical modules E1, E2, E4, components corresponding to the respective components of the optical module 1A have the same reference marks as the components of the optical module 1A for explanation. Each of the optical modules E1, E2, E4 is not equipped with a moisture absorbent 13. The optical module E3 corresponds to the optical module E1 equipped with a moisture absorbent 13 on an inner wall of a cap 12A. Accordingly, even in a description of the optical module E3, components corresponding to the respective components of the optical module 1A have the same reference marks as the components of the optical module 1A for explanation.

In each of the optical modules E1, E2, E3, E4, a first LD 21 was a red LD chip having an oscillation wavelength of 640 nm. A second LD 22 was a green LD chip having an oscillation wavelength of 525 nm. A third LD 23 was a blue LD chip having an oscillation wavelength of 450 nm. An internal space of a package 10A of each of the optical modules E1 to E4 had a volume of about 400 mm$^3$.

(Optical Module E1)

The optical module E1 was made by following the steps shown in FIG. 5. First, an optical component mounting assembly 2A was made. In the production of the optical component mounting assembly 2A, the first through third LDs 21 to 23 were bonded to a first through a third sub-mount 61 to 63, respectively by AuSn solder. The first through third sub-mounts 61 to 63, a TEC 112, a PD 45, and a thermistor 43 were bonded to the base member 113 by Ag paste. The base member 113A used had a first through a fifth sub-base member 71 to 75 that were integrally formed with its second surface 113b.

A multiplexing optical system 30 or a first through a third collimator lens 31 to 33 and a first and a second wavelength selective filter 34, 35 were bonded to a support 11 by ultraviolet curable resin (model SA1801SN, epoxy-type resin manufactured by Dexerials). A beam splitter 44 was fixed to a mount 90 by ultraviolet curable resin.

Subsequently, the optical component mounting assembly 2A and the cap 12A were baked at a temperature of 80° C. for four hours in a dry air atmosphere with a dew point of −50° C., and thereafter, the cap 12A was welded to the support 11 by means of a resistance welding machine in a dry air atmosphere with a dew point of −50° C.

(Optical Module E2)

The optical module E2 was made in a manner similar to the optical module E1, except that the baking step carried out in the production of the optical module 1 in the illustrative experiment 1 was carried out here at a temperature of 80° C. for two hours.

(Optical Module E3)

The optical module E3 was made in a manner similar to the optical module E1, except that the optical module E3 uses the cap 12A that is provided with the moisture absorbent 13 on its inner wall. For the moisture absorbent 13, calcium-based material in paste form was used by being applied to the inner wall of the cap 12A.

(Optical Module E4)

The optical module E4 was made by making an optical component mounting assembly 2A in a manner similar to the optical module E1, and without carrying out a baking step, joining a cap 12A to a support 11. A welding method for joining the cap 12A to the support 11 is similar to that of the optical module E1.

(Optical Module Energization Test)

An energization test was conducted on the optical modules E1, E3, E4. In the energization test conducted, the first through third LDs 21 to 23 were caused to perform simultaneous light emission with a constant current value, and the package 10A had a temperature of 35° C. Initial output of the third LD 23 was adjusted to 25 mW, and the third LD 23 had its output measured at 300 hours after the start of the test for calculation of its output degradation rate. The output of the third LD 23 was measured by means of a PD with the light emission of the first and second LDs 21, 23 stopped during the output measurement. When the output of the third LD 23 was I [mW] at 300 hours after the start of the test, the output degradation rate was defined by (I/25)×100(%). In a manner similar to the third LD 23, the first and second LDs 21, 22 of each of the optical modules E1, E3, E4 had their respective output degradation rates calculated.

(Moisture Content Measurement Test)

An internal moisture content of the package 10A of the produced optical module E1, E2, E3, E4 was measured in accordance with a method defined in MIL Specification 883 or, more specifically, in accordance with method 1018.2 of M IL-STD-883E that relates to INTERNAL WATER-VAPOR CONTENT. For the measurement, a quadrupole mass spectrometer (model QMI422/QMA-125 manufactured by Pfeiffer Vacuum) was used. The optical modules E1, E2, E3, E4 used in the moisture content measurement test were other samples that were made under the same conditions as the samples used in the optical module energization test.

(Test Results)

Figure 20:
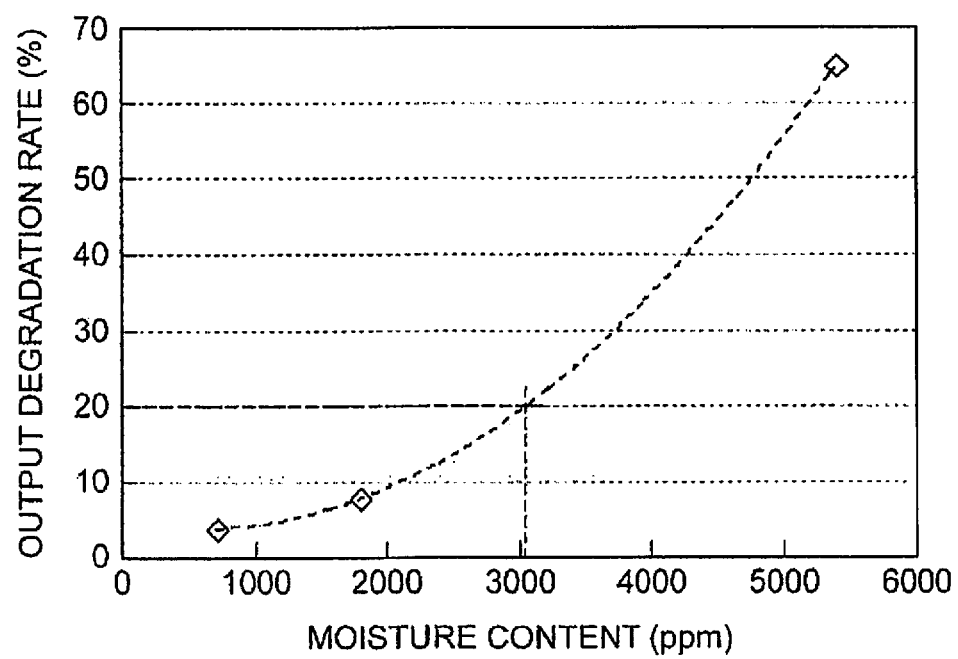
FIG. 20 is a graph plotted from experiment results.

FIGS. 20 and 21 show results of the optical module energization test and results of the moisture content measurement test. FIG. 20 shows the respective output degradation rates of the optical modules E1, E3, E4 that are each plotted against the moisture content. In FIG. 20, a horizontal axis shows the moisture content (ppm), while a vertical axis shows the output degradation rate. In FIG. 20, a broken line connecting plot points is a fitting curve fitted to the plot points. FIG. 21 is a table compiling the results of the optical module energization test and the results of the moisture content measurement test. In FIG. 21, the output degradation rate of the optical module E2 is a value estimated based on the fitting curve of FIG. 20.

As is clear from FIGS. 20 and 21, as the moisture content decreases, the output degradation rate of the third LD 23 decreases among the optical modules E1 to E4. It is thus evident that even when the ultraviolet curable resin and the Ag paste are present inside the package, the output degradation of the third LD 23 can be reduced by decreasing the moisture content. This is conceivably became moisture is involved in migration of contaminants. Though not shown in FIGS. 20 and 21, the output degradation rates of the first and second LDs 21, 22 were also calculated in the optical module energization test as described earlier. However, substantial output degradation was not caused to each of the first and second LDs 21, 22. It is therefore evident that that the output degradation of the third LD 23 is predominant.

The moisture content can be decreased by adjusting, for example, the baking time. Specifically, the moisture content becomes not more than 3000 ppm as a result of baking carried out for not less than two hours and not more than 2000 ppm as a result of baking carried out for not less than four hours. Furthermore, it is evident that through use of the moisture absorbent, the moisture content can be decreased further (to not more than, for example, 1000 ppm) even in the same baking step.

The moisture content (ppm) corresponding to a conceivably acceptable output degradation rate (20%) of the third LD 23 in the optical module is, for example, about 3050 ppm. Accordingly, with the moisture content being not more than 3000 ppm, the output degradation rate of the third LD 23 can be decreased to not more than 20%, which is the acceptable output degradation rate, even when the ultraviolet curable resin and the Ag paste are used in the production of the optical module. Consequently, the optical module containing not more than 3000 ppm of moisture inside the package can have its reliability prevented from being deteriorated and enables improved productivity and reduced manufacturing costs. The initial optical output here was 25 mW; however, even when the optical output is lowered further, a dust collection effect is still problematic although progressing slowly. The present invention is effective even for an optical module having a lower optical output.

The embodiments of the present invention have been described above. However, those embodiments are not restrictive of the present invention, and modifications or other applications may be included without changing the gist of each claim. This means that the present invention is susceptible of various modifications within a scope not changing its gist.

For example, each of the optical modules described so far are mounted with the three LDs. However, the optical module may include a plurality of LDs, and at least one of the plurality of LDs may have an oscillation wavelength of not more than 550 nm. Thus, the optical module may have two LDs or four or more LDs. Respective oscillation wavelengths of the plurality of LDs of the optical module may not necessarily be all different as illustrated.

The support of the package of the optical module may not necessarily include the TEC. In such a case, the support includes the stem and the base member with the base member being mounted on the stem. The support may be any member that is mounted with the plurality of LDs and the multiplexing optical system, provided that there is no departure from the gist of the present embodiments.

In each of the above embodiments, the first wavelength selective filter 34 is used for transmitting the first laser beam L1 collimated by the first collimator lens 31 and reflecting the second laser beam L2 collimated by the second collimator lens 32 forward. However, the first wavelength selective filter 34 can be replaced by, for example, a wavelength selective filter that reflects the first laser beam L1 and transmits the second laser beam L2. In place of the second wavelength selective filter 35 that transmits the first resultant light beam ML1 and reflects the third laser beam L3, a wavelength selective filter that reflects the first resultant light beam ML1 and transmits the third laser beam L3 can be used.

With regard to the description so far, the internal space of the package that accommodates the plurality of LDs and the multiplexing optical system may have a volume of less than 200 mm$^3$. However, when the plurality of LDs (particularly the three or more LDs) and the multiplexing optical system are accommodated by the package, the volume of the internal space of the package tends to be not less than 200 mm$^3$. By using the resin curing adhesive that allows the simplified step of joining the multiplexing optical system to the support, the package having such a large volume enables further enhancement of the productivity.

What is claimed is:

1. An optical module comprising:
    a plurality of laser diodes;
    a multiplexing optical system combining a plurality of laser beams emitted from the respective plurality of laser diodes and emitting a resultant light beam of the plurality of laser beams; and
    a package accommodating the plurality of laser diodes and the multiplexing optical system,
    wherein the package comprises:
    a support mounted with the plurality of laser diodes and the multiplexing optical system; and
    a cap joined to the support for hermetically enclosing the plurality of laser diodes and the multiplexing optical system that are mounted to the support, the cap including a transmissive window for allowing the resultant light beam to pass through,
    wherein at least one of the plurality of laser diodes has an oscillation wavelength of not more than 550 nm,
    wherein the package has an internal moisture content of not more than 3000 ppm, and wherein the multiplexing optical system is fixed to the support by a resin curing adhesive.

2. The optical module according to claim 1, wherein an internal space of the package is defined by the support and the cap and has a volume of not less than 200 mm³.

3. The optical module according to claim 1, wherein:
the plurality of laser diodes is mounted to the support via respective sub-mounts corresponding to the respective plurality of laser diodes; and
the sub-mounts are each fixed to the support by a conductive adhesive.

4. The optical module according to claim 1, wherein the oscillation wavelength ranges from 435 nm to 465 mn.

5. The optical module according to claim 1, wherein the oscillation wavelength ranges from 390 nm to 420 nm.

6. The optical module according to claim 1, further comprising a moisture absorbent disposed inside the package.

7. The optical module according to claim 6, wherein the moisture absorbent is provided to an inner wall of the cap.

8. The optical module of claim 1, wherein:
the support comprises a stem, and a base member mounted to the stem; and
the plurality of laser diodes and the multiplexing optical system are mounted to the base member.

9. The optical module according to claim 1, wherein the multiplexing optical system comprises:
a plurality of collimator lenses converting the plurality of laser beams to substantially collimated light beams, respectively, the plurality of collimator lenses corresponding to the respective plurality of laser beams emitted from the respective plurality of laser diodes; and
a plurality of wavelength selective filters combining the substantially collimated light beams converted from the plurality of laser beams by the plurality of collimator lenses into one laser beam.

10. The optical module according to claim 1, wherein the internal moisture content of the package is not more than 2000 ppm.

11. The optical module according to claim 10, wherein the internal moisture content of the package is not more than 1000 ppm.

12. A method for manufacturing an optical module in which a package including a support and a cap accommodates a plurality of laser diodes and a multiplexing optical system that combines a plurality of laser beams emitted from the respective plurality of laser diodes for generation of a resultant light beam that is emitted from a transmissive window provided to the cap, the method comprising the steps of:

preparing an optical component mounting assembly including the plurality of laser diodes and the multiplexing optical system that are mounted to the support; and sealing the plurality of laser diodes and the multiplexing optical system above the support with the cap through joining of the cap and the support of the optical component mounting assembly so that the package has an internal moisture content of not more than 3000 ppm, wherein at least one of the plurality of laser diodes has an oscillation wavelength of not more than 550 nm, and wherein the multiplexing optical system of the optical component mounting assembly is bonded to the support by a resin curing adhesive.

13. The method for manufacturing the optical module according to claim 12, wherein the step of sealing comprises the steps of:

baking the optical component mounting assembly and the cap that is to be joined to the support in a dry air atmosphere; and joining the cap to the support in a dry air atmosphere so that the baked cap hermetically encloses the plurality of laser diodes and the multiplexing optical system of the baked optical component mounting assembly.

* * * * *